US011272648B2

(12) United States Patent
Kawaguchi et al.

(10) Patent No.: US 11,272,648 B2
(45) Date of Patent: Mar. 8, 2022

(54) COMPONENT MOUNTING MACHINE

(71) Applicant: FUJI CORPORATION, Chiryu (JP)

(72) Inventors: Koji Kawaguchi, Kasugai (JP);
Toshihiko Yamasaki, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 42 days.

(21) Appl. No.: 16/637,449

(22) PCT Filed: Aug. 9, 2017

(86) PCT No.: PCT/JP2017/028952
§ 371 (c)(1),
(2) Date: Feb. 7, 2020

(87) PCT Pub. No.: WO2019/030864
PCT Pub. Date: Feb. 14, 2019

(65) Prior Publication Data
US 2020/0253100 A1    Aug. 6, 2020

(51) Int. Cl.
*H05K 13/04* (2006.01)
*H05K 13/08* (2006.01)

(52) U.S. Cl.
CPC ..... *H05K 13/0409* (2018.08); *H05K 13/0413* (2013.01); *H05K 13/0452* (2013.01); *H05K 13/08* (2013.01)

(58) Field of Classification Search
CPC ........... H05K 13/0409; H05K 13/0413; H05K 13/0452; H05K 13/04
See application file for complete search history.

(56) References Cited

U.S. PATENT DOCUMENTS

| | | | |
|---|---|---|---|
| 6,610,991 B1 * | 8/2003 | Case | G01B 11/024 250/559.19 |
| 2006/0111222 A1 * | 5/2006 | Yasui | H05K 13/0409 483/1 |

FOREIGN PATENT DOCUMENTS

| | | |
|---|---|---|
| EP | 3 064 331 | 8/2016 |
| JP | 7-290389 A | 11/1995 |

(Continued)

OTHER PUBLICATIONS

International Search Report dated Nov. 7, 2017 in PCT/JP2017/028952 filed on Aug. 9, 2017, 2 pages.

*Primary Examiner* — Peter Dungba Vo
*Assistant Examiner* — Jose K Abraham
(74) *Attorney, Agent, or Firm* — Oblon, McClelland, Maier & Neustadt, L.L.P.

(57) ABSTRACT

A component mounting machine, includes a mounting base provided in a component mounting machine main body and movable at least in the horizontal direction; a mounting/demounting tool, detachably mounted on the mounting base and movable in the up-down direction while holding a component; a tool moving mechanism configured to move the mounting/demounting tool in the up-down direction; a mounting base moving mechanism configured to move the mounting base at least in the horizontal direction; and a control device configured to perform a seating improvement process for applying a force in a predetermined direction, including the horizontal direction, to the mounting base on which the mounting/demounting tool is mounted after the mounting/demounting tool is mounted on the mounting base and before the mounting/demounting tool holds the component, by a moving operation different from a moving operation for holding the component on the mounting/demounting tool in the mounting base moving mechanism.

6 Claims, 13 Drawing Sheets

(56) References Cited

FOREIGN PATENT DOCUMENTS

| | | | |
|---|---|---|---|
| JP | 11-220293 A | | 8/1999 |
| JP | 2009117780 A | * | 5/2009 |
| JP | 2012156413 A | * | 8/2012 |
| JP | 2017-92200 A | | 5/2017 |
| JP | 2017092200 A | * | 5/2017 |
| WO | WO-2014069016 A1 | * | 5/2014 ........... H05K 13/087 |
| WO | WO 2015/059839 A1 | | 4/2015 |

* cited by examiner

COMPONENT MOUNTING MACHINE

TECHNICAL FIELD

The present specification relates to a component mounting machine.

BACKGROUND ART

Conventionally, there has been known a component mounting machine including a component mounting head for picking up a component by suction and mounting the component on a board (e.g., see Patent Literature 1). The component mounting head includes a head main body mounted on a base of the component mounting machine, a suction nozzle detachably mounted on the head main body, and a nozzle lifting and lowering mechanism for moving the suction nozzle up and down with respect to the head main body.

The head main body can move in the horizontal direction with respect to the base while holding the suction nozzle. The nozzle lifting and lowering mechanism has a lifting and lowering shaft which is held by the head main body such that the lifting and lowering shaft can be lifted and lowered. A coil spring and a locking ring are fitted on the outer periphery of the lower end of the lifting and lowering shaft. In a state in which the suction nozzle is not mounted, the locking ring is positioned at a position in which the gravitational force of the locking ring is balanced with the urging force of the coil spring with respect to the lifting and lowering shaft. A pair of slots facing each other with the axial center therebetween are formed in the side wall at the lower end of the lifting and lowering shaft. Each slot is a J-shaped slot extending upward from an opening at the lower end of the lifting and lowering shaft, then extending in a circumferential direction, and then slightly extending downward.

The suction nozzle is detachably mounted to the lower end of the lifting and lowering shaft attached to the head main body. That is, the suction nozzle has a nozzle main body at the lower end for picking up components by suction and has a nozzle holder section at the upper end detachably held with respect to the lifting and lowering shaft. The nozzle holder section has a cylindrical section, which is inserted into an attachment hole at the lower end of the lifting and lowering shaft, and a pair of locking pins protruding radially outward from the side wall of the cylindrical section. The suction nozzle is mounted to the lifting and lowering shaft by inserting the cylindrical section into the attachment hole of the lifting and lowering shaft, inserting and engaging the locking pins into the slot of the lifting and lowering shaft from the lower end, pushing up the locking ring against the urging force of the coil spring, and then, after the locking pins reach a seating portion at the innermost portion of the slot, pushing down the lower face of the locking ring by the urging force of the coil spring. The suction nozzle is fitted into the lifting and lowering shaft with a clearance provided by an O-ring or the like.

In the component mounting machine described above, after the suction nozzle is exchanged, the lifting and lowering shaft to which the suction nozzle is mounted is lowered with respect to the head main body so that the lower end of the suction nozzle is pressed against the upper face of a jig base. In this case, since the suction nozzle is pressed upward, the seating position of the suction nozzle with respect to the lifting and lowering shaft is stabilized, thereby improving the positioning accuracy of the suction nozzle.

PATENT LITERATURE

Patent Literature 1: Japanese Patent Application Laid-Open No. 2017-92200

BRIEF SUMMARY

Technical Problem

However, as described above, when the suction nozzle is pressed against the jig base at the lower end after being exchanged, although it is possible to improve the seating of the suction nozzle in the up-down direction with respect to the lifting and lowering shaft, it is difficult to improve the horizontal seating including the angular deviation and the offset deviation of the suction nozzle axis.

This phenomenon also occurs in a structure in which a push-up pot provided in a die supply device is mechanically clamped to a robot with a taper clamp or the like. Generally, with a taper clamp or the like, shifting of the shaft may occur due to a slight deviation in the shape or assembly. Therefore, even if a push-up pot is pressed against a jig base from the top after an exchange, it is difficult to improve the seating, particularly in the horizontal direction, only by applying a downward pressing force on the push-up pot.

It is an object of the present specification to provide a component mounting machine capable of stabilizing the seating of a mounting/demounting tool detachably mounted on a mounting base.

Solution to Problem

The present specification discloses a component mounting machine, comprising: a mounting base provided in a component mounting machine main body and movable at least in the horizontal direction; a mounting/demounting tool, detachably mounted on the mounting base and movable in the up-down direction while holding a component; a tool moving mechanism configured to move the mounting/demounting tool in the up-down direction; a mounting base moving mechanism configured to move the mounting base at least in the horizontal direction; and a control device configured to perform a seating improvement process for applying a force in a predetermined direction, including the horizontal direction, to the mounting base on which the mounting/demounting tool is mounted after the mounting/demounting tool is mounted on the mounting base but before the mounting/demounting tool holds the component, by a moving operation different from the moving operation for holding the component on the mounting/demounting tool in the mounting base moving mechanism.

According to the present disclosure, the seating improvement process is executed after the mounting/demounting tool is mounted on the mounting base but before the mounting/demounting tool holds a component, and a force is applied to the mounting base in a predetermined direction including the horizontal direction by a moving operation different from the moving operation for holding a component in the mounting base moving mechanism. By the action of this force, the mounting base and the mounting/demounting tool can move relative to each other. Therefore, it is possible to improve the engagement between the mounting base and the mounting/demounting tool such that the positional relationship between them is stable. Thus, it is possible to stabilize the seating of the mounting/demounting tool detachably mounted to the mounting base.

DESCRIPTION OF EMBODIMENT

1. Configuration of the Component Mounting Machine

Figure 1:
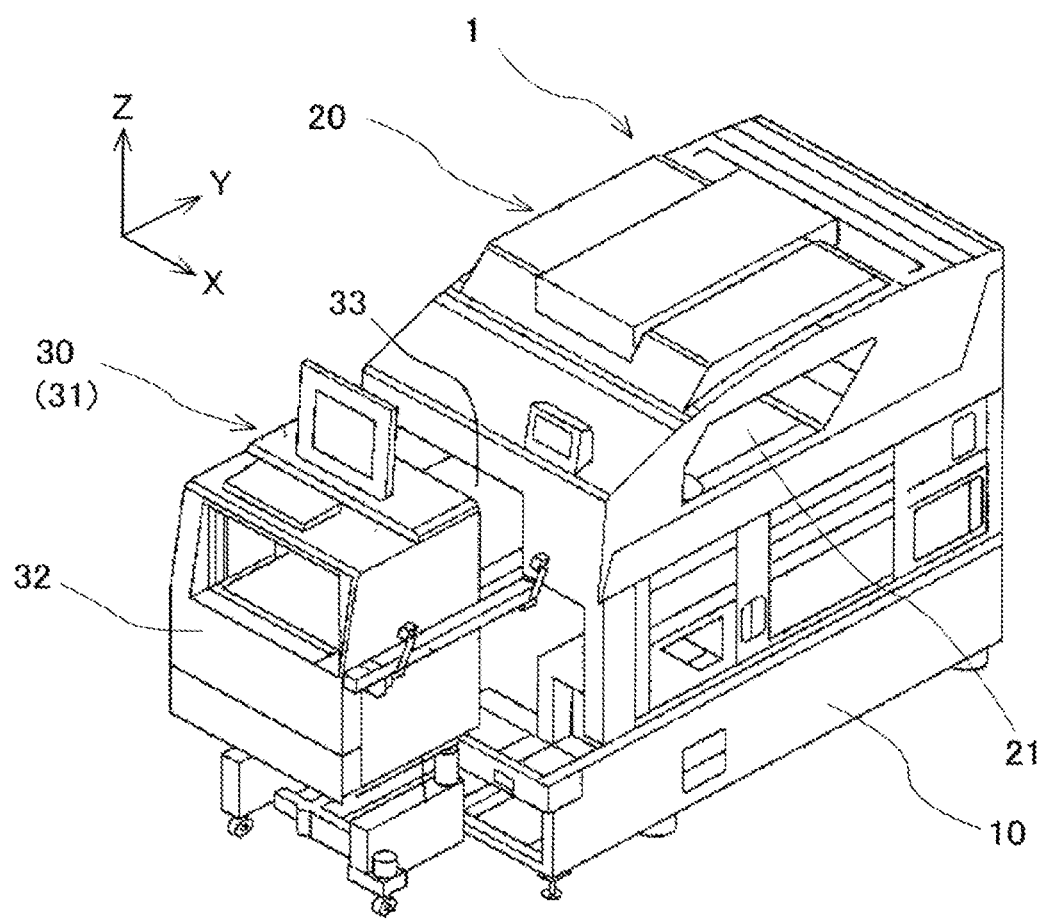
FIG. 1 An external perspective view of a component mounting machine according to an embodiment.
Figure 2:
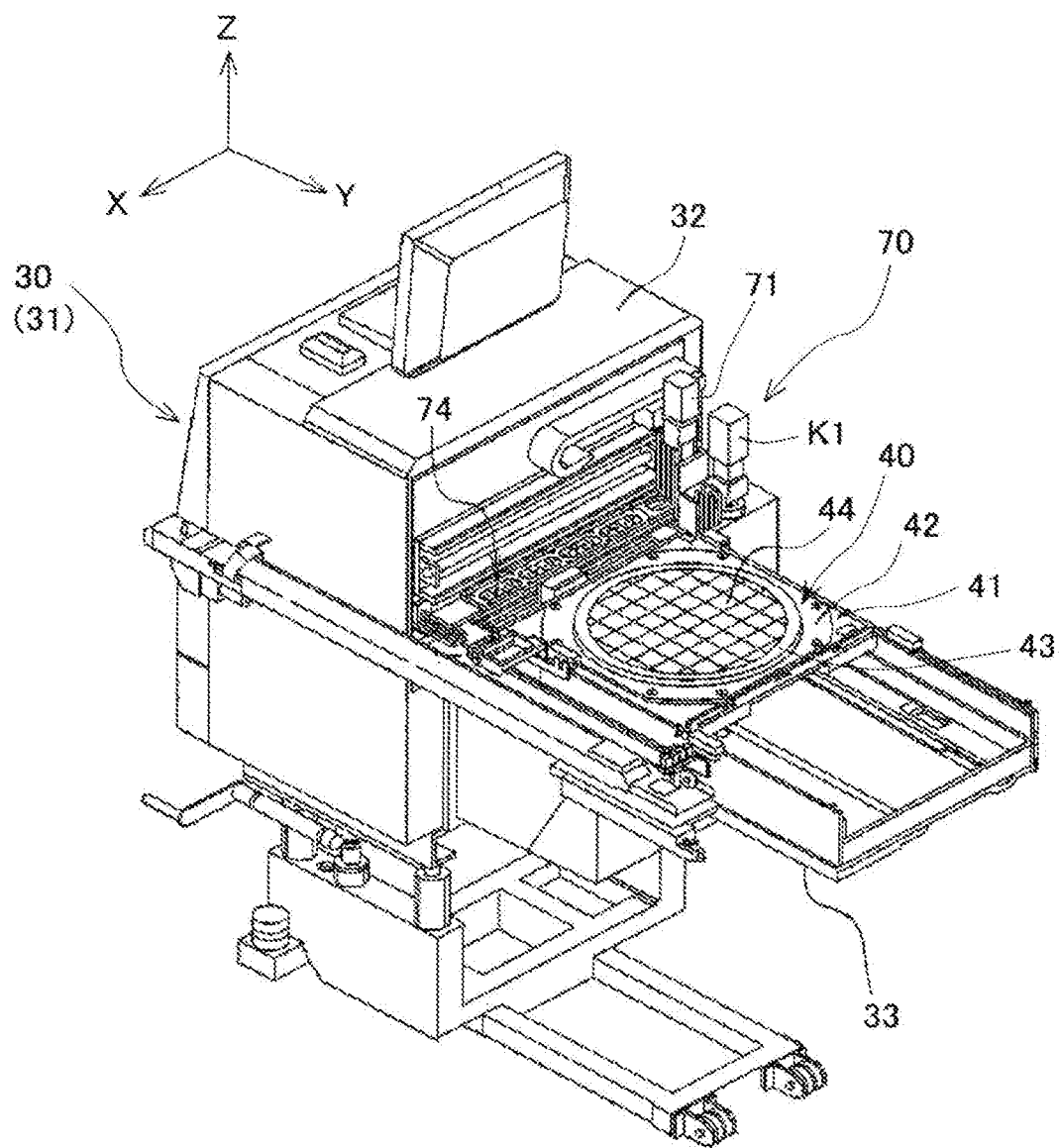
FIG. 2 An external perspective view of a component supply device provided in a component mounting machine according to the embodiment.

The configuration of component mounting machine 1 according to one embodiment will be described with reference to FIGS. 1 to 10. Component mounting machine 1 is a device for mounting a component on a board such as a circuit board. As shown in FIGS. 1 and 2, component mounting machine 1 includes board conveyance device 20, component supply device 30, and component transfer device 70. Board conveyance device 20, component supply device 30, and component transfer device 70 are mounted on main body section 10, which is a base of component mounting machine 1.

Board conveyance device 20 is a device for conveying a board. Board conveyance device 20 includes a pair of guide rails (not shown), conveyor belt 21, and a clamping device (not shown). The pair of guide rails are arranged in parallel with each other with a space therebetween. The guide rails guide the board in conveyance direction X. Conveyor belt 21 is a belt member on which a board can be placed and can be rotated by an electric motor or the like. A board is conveyed in conveyance direction X by conveyor belt 21 while being guided by the pair of guide rails. The clamping device is disposed on conveyor belt 21. When a board is conveyed to a predetermined component mounting position by conveyor belt 21, the board is positioned by the clamping device. Conveyor belt 21, the guide rails, and the clamping device of board conveyance device 20 can be appropriately exchanged according to the type, size, shape, and the like of the board.

Component supply device 30 is a device for supplying a component, to be mounted on a board, to a pickup position. Component supply device 30 has die supply device 31 for supplying a die as a component to be mounted on a board.

Figure 3:
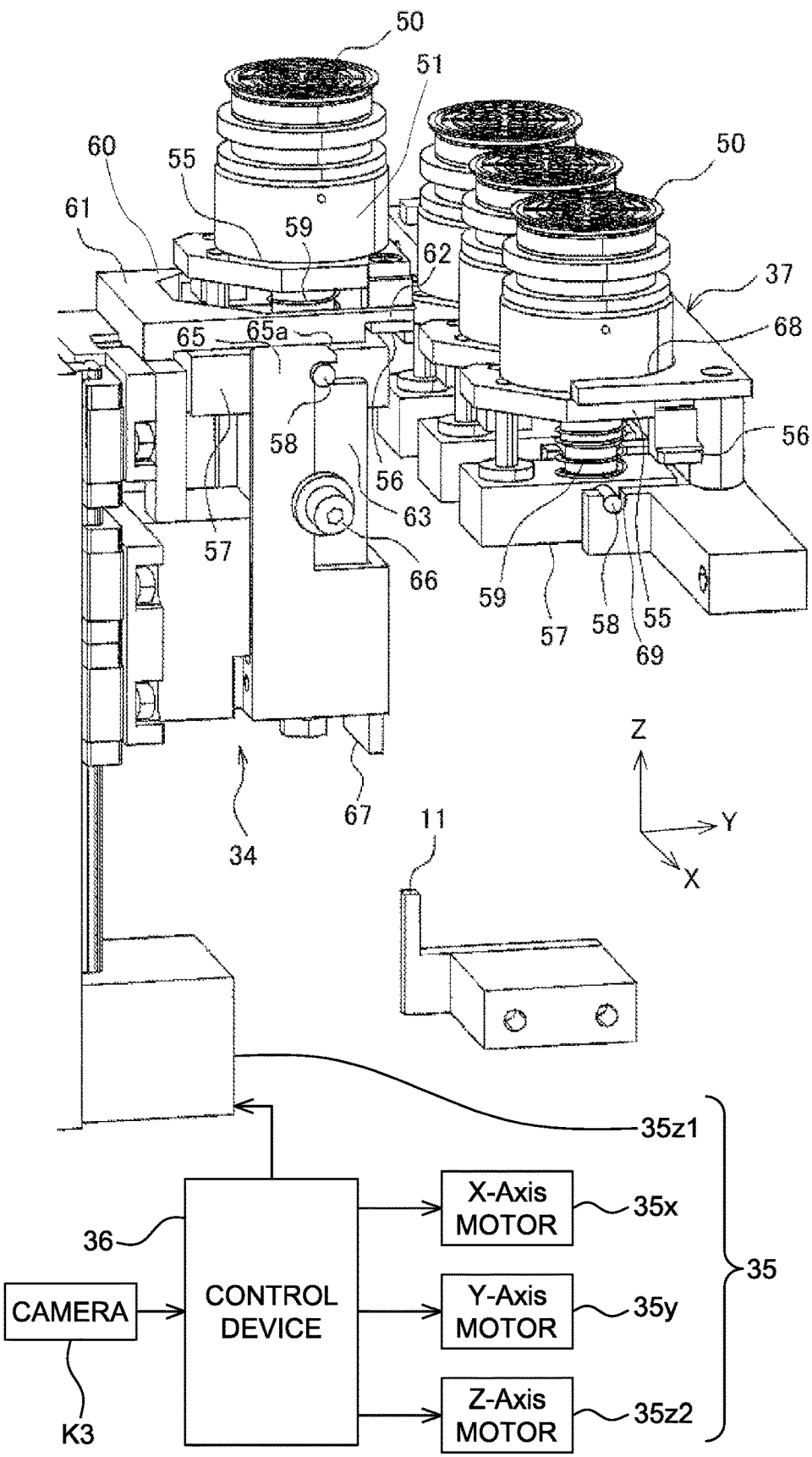
FIG. 3 A configuration diagram including an external perspective view of a push-up unit and a pot station of the component supply device according to the embodiment.
Figure 4:
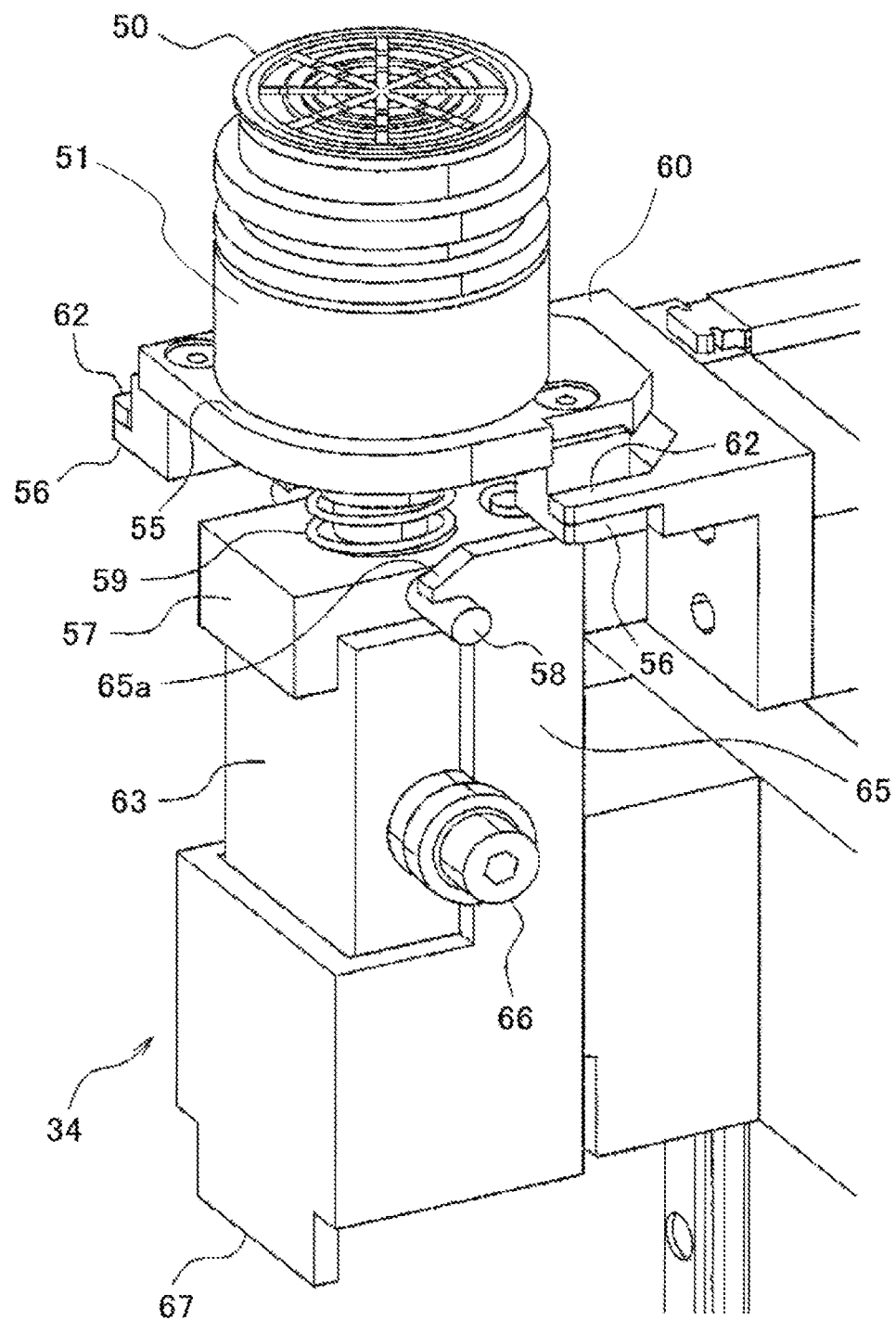
FIG. 4 An external perspective view of the push-up unit according to the embodiment.

As shown in FIGS. 3 and 4, die supply device 31 includes magazine holding section 32, pallet pull-out table 33, push-up unit 34, driving device 35, control device 36, and pot station 37. Die supply device 31 is set such that pallet pull-out table 33 is inserted into main body section 10 of component mounting machine 1.

Magazine holding section 32 accommodates magazines such that magazines can be moved up and down. Wafer pallet 40 and a tray pallet (not shown) are mounted on each magazine. These pallets are stacked on multiple stages in the up-down direction. Each magazine is configured to select one of wafer pallet 40 and the tray pallet and pull out the selected pallet onto pallet pull-out table 33 when component mounting machine 1 is in operation. The pallet is pulled out onto pallet pull-out table 33 by a pallet pull-out mechanism, not shown, to a predetermined pull-out position.

As shown in FIG. 2, wafer pallet 40 has pallet main body 41 and wafer mounting plate 42 attached to pallet main body 41 by screwing or the like. Wafer mounting plate 42 has a circular opening penetrating in the up-down direction. An expandable and contractible sheet-shaped dicing sheet 43 is mounted on wafer mounting plate 42 so as to cover the opening of wafer mounting plate 42 in an expanded state. Die 44, formed by dicing a wafer in a grid-shaped pattern, is adhered to dicing sheet 43 as a component to be mounted on the board.

Push-up unit 34 is disposed in a spatial region below wafer pallet 40. Push-up unit 34 is configured to move in the X and Y directions within the spatial region. Push-up unit 34 is a unit for floating die 44 upward, dicing sheet 43 of which being on wafer pallet 40 pulled out onto pallet pull-out table 33, by locally pushing up die 44 from below with push-up pin 52 of push-up pot 50, which will be described later, so as to partially peel off the attached portion of die 44 from dicing sheet 43.

Push-up unit 34 includes push-up pot 50. Push-up pot 50 includes pot body 51 and push-up pin 52. Pot body 51 is a barrel member having a substantially cylindrical shape. Pot body 51 has pin hole 53 extending along the axial direction of pot body 51 and is open at the upper face of pot body 51. Push-up pin 52 is a member having a pin shape to be inserted into pin hole 53 of pot body 51. Push-up pin 52 can move up and down in pin hole 53 and can protrude upward from the upper face of pot body 51.

Pot body 51 has vacuum hole 54 extending in the axial direction of pot body 51 and is open at the upper face of pot body 51. Vacuum hole 54 may be provided at multiple locations on the upper face of pot body 51. A vacuum pump (not shown) is connected to vacuum hole 54. Negative pressure is introduced to vacuum hole 54 by operation of a vacuum pump. Negative pressure guided to vacuum hole 54 sucks dicing sheet 43 into contact with the upper face of pot body 51. In order to suck dicing sheet 43 to the upper face of pot body 51, instead of providing vacuum hole 54 in pot body 51, pot body 51 itself may be made of a porous material.

Annular flange section 55 is provided at the lower portion of pot body 51. L-shaped hooking piece 56 is provided on flange portion 55 so as to protrude radially outward. A pair of hooking pieces 56 is provided, with the axial center of the pot main body 51 interposed therebetween. Engagement member 57 is provided below the center of pot body 51 so as to be movable by a predetermined amount in the up-down direction (i.e., the Z-direction). Engagement member 57 has a rectangular block shape. A pair of lock pins 58 are provided on engagement member 57 so as to face outward with the axial center of pot body 51 interposed therebetween. Spring 59 is mounted between the lower face of pot body 51 and the upper face of engagement member 57. Spring 59 generates a spring force for urging engagement member 57 including lock pin 58 downward with respect to pot body 51.

Push-up unit 34 has one pot holding section 60. One push-up pot 50 is held by pot holding section 60. Pot holding section 60 is provided with positioning block 61. Positioning block 61 has positioning members 62. Positioning members 62 are provided at two positions corresponding to the pair of hooking pieces 56 of pot main body 51. Each positioning member 62 engages with hook pieces 56 of pot body 51 on the lower face side thereof. When this engagement is performed, the holding position of push-up pot 50 becomes fixed in the XYZ directions.

Figure 5:
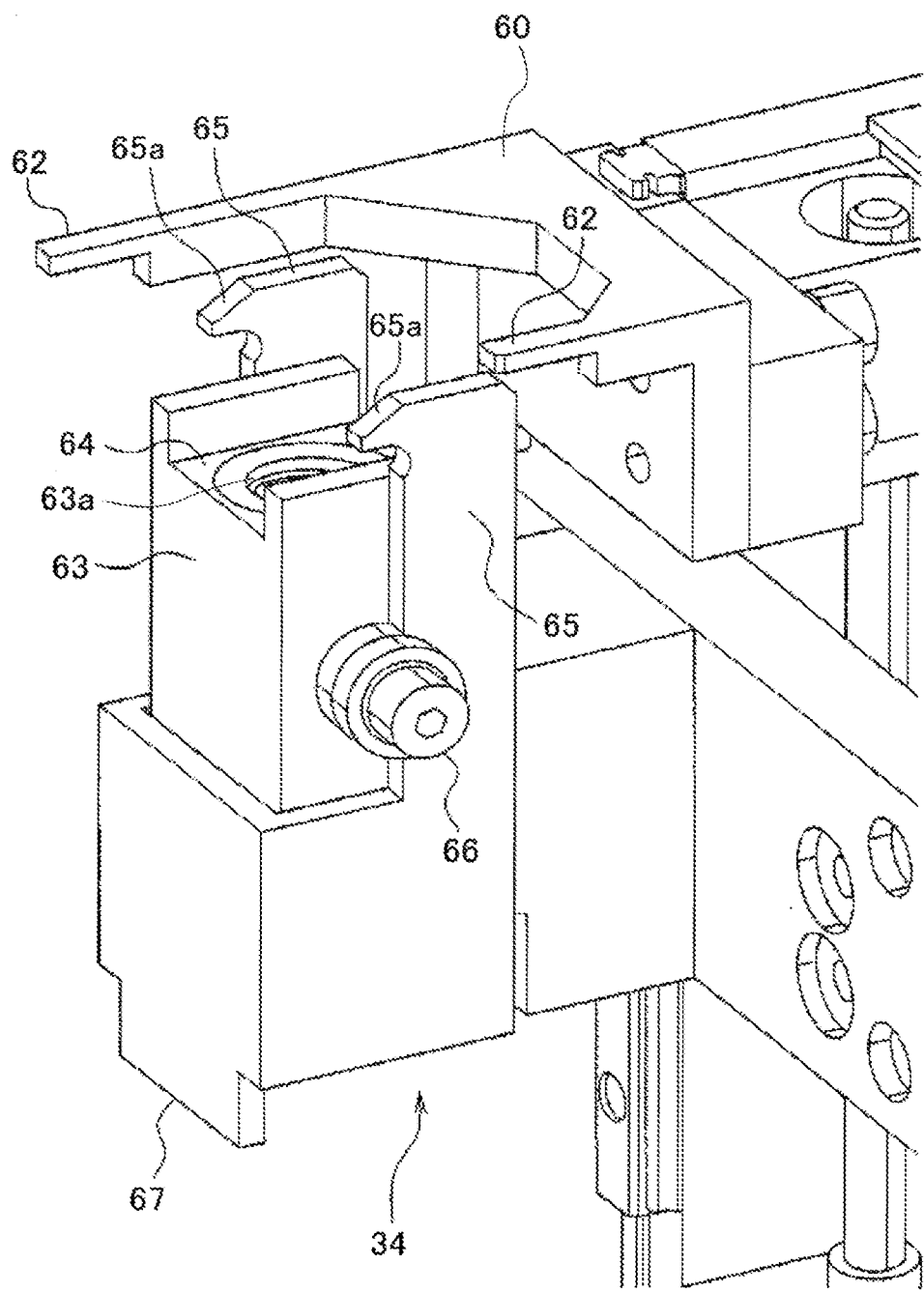
FIG. 5 An external perspective view of the push-up unit of the embodiment with the push-up pot removed.
Figure 6:
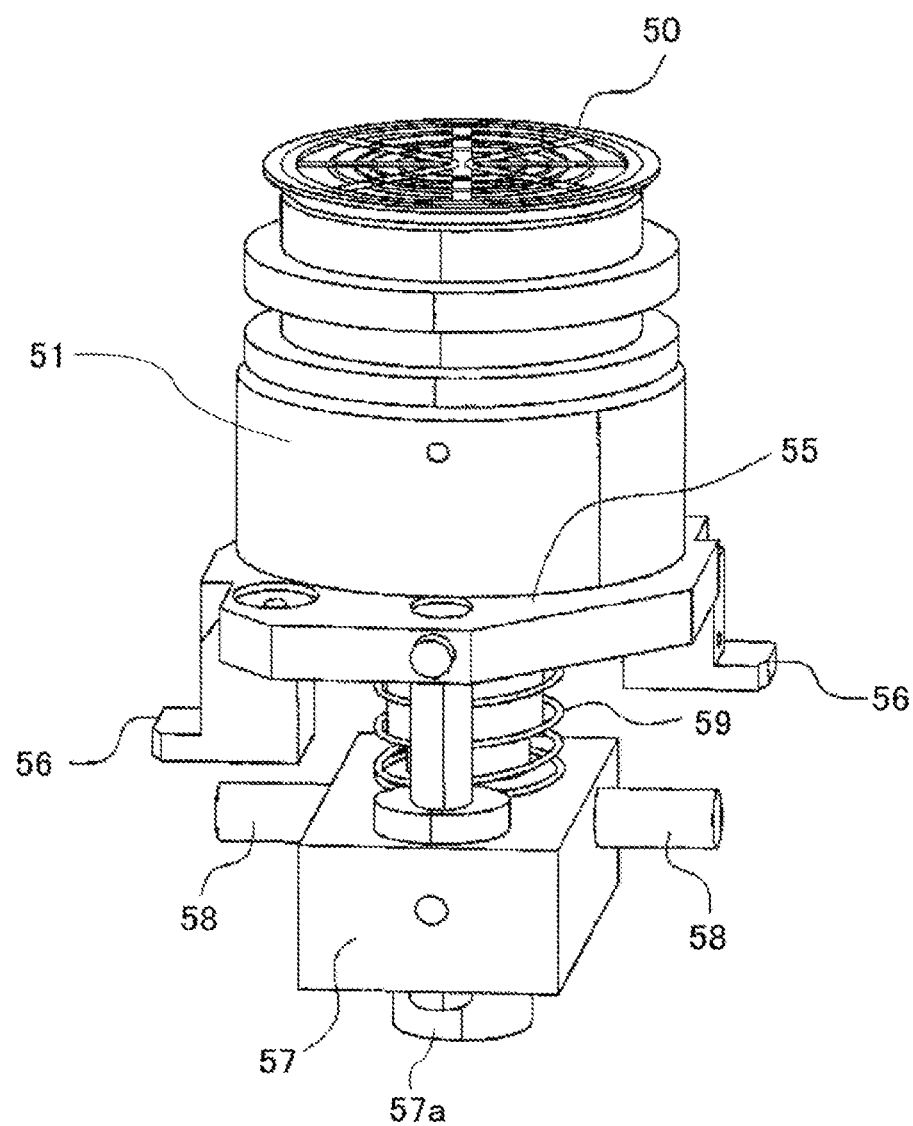
FIG. 6 An external perspective view of the push-up pot included in the push-up unit of the embodiment.

Pot holding section 60 is provided with engaging block 63. As shown in FIG. 5, engaging block 63 has fitting recessed section 64. Engagement member 57 of push-up pot 50 fits into fitting recessed section 64 from above. Fitting 63a of a vacuum pipe connected to a vacuum pump is provided on the upper face of engaging block 63, that is, the bottom face of fitting recessed section 64. Fitting 63a is connected to vacuum pipe 57a (see FIG. 6) of engagement member 57 that communicates with vacuum hole 54 of pot body 51 by fitting engagement member 57 into fitting recessed section 64.

The engagement of engagement member 57 into engagement recess 64 is carried out in the states of the holding position of push-up pot 50 being fixed by positioning member 62 and engagement member 57 compressing spring 59, against the spring force of spring 59 so as to pushes spring 59 upward toward pot body 51. In this configuration, the two lock pins 58 of engagement member 57 protrude outward in a state where they abut against or are close to the top end of the side wall portions of fitting recessed section 64 of engaging block 63.

Engaging block 63 is provided with lock member 65. Lock pin 58 of engagement member 57, fitted in fitting recessed section 64 of engaging block 63, engages with lock member 65. Engaging member 57 is locked when lock pin 58 engages with lock member 65. Lock member 65 is rotatably supported between a locked position and an unlocked position with pivot shaft 66 as a fulcrum. Lock member 65 is biased toward the locked position by a spring (not shown). Lock member 65 has hook section 65a having an inclined surface at an upper edge section thereof.

At the lower end of lock member 65, protrusion 67 for an unlocking operation projects downward. The rotation of lock member 65 to an unlocked position is performed by moving push-up unit 34 to an unlocking operational position, hooking the above-mentioned protrusion 67 to hook 11 of main body section 10, and moving push-up unit 34 in the unlocking direction (i.e., the Y-direction). When lock member 65 is rotated to the unlocked position, hook section 65a of lock member 65 disengages from lock pin 58, releasing the lock of lock pin 58. Lock pin 58 is provided so as to be movable up and down by 1 mm to several mm with respect to engagement member 57, and is urged upward by a spring (not shown). When lock member 65 is rotated to the unlocked position, lock pin 58 is pushed up by the spring force and the tip of hook section 65a of lock member 65 abuts against the side surface of lock pin 58 so that the unlocked state is maintained.

Figure 7:
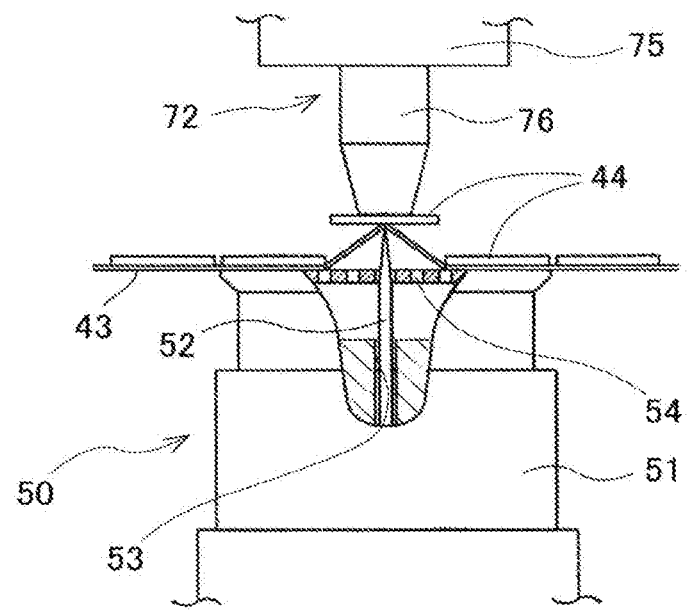
FIG. 7 A partial cross-sectional view showing a state in which the push-up pin of the push-up pot of the embodiment pushes up against a die.

Pot holding section 60 of push-up unit 34 is configured to be driven by driving device 35 in the up-down direction (Z-direction) with respect to main body section 10 of component mounting machine 1. When pot holding section 60 is raised by driving device 35, push-up pot 50 held by pot holding section 60 is raised. When the upper face of pot body 51 is raised to a predetermined sheet suction position where the upper face of pot body 51 contacts dicing sheet 43 of the wafer pallet 40, a stopper mechanism (not shown) is operated to stop the raising of pot body 51. Further, when pot holding section 60 continues to ascend, as shown in FIG. 7, push-up pin 52 protrudes upward from the upper face of pot body 51, whose ascension has been stopped, and pushes up the attached portion of die 44, to be picked up by suction, from dicing sheet 43. When push-up pin 52 is pushed up, the attached portion of die 44 partially separates from dicing sheet 43, and die 44 floats upward. Push-up height of push-up pin 52 is adjusted by the driving amount of driving device 35.

When push-up pin 52 pushes up die 44 of dicing sheet 43, negative pressure is guided to vacuum hole 54 of pot body 51 so that dicing sheet 43 is sucked to the upper face of pot body 51. With the suction of dicing sheet 43, dicing sheet 43 is easily held on the upper face of pot main body 51 so that die 44 can be easily separated from dicing sheet 43 by the thrust of push-up pin 52.

Multiple types of push-up pots 50 are provided in accordance with the size and type of die 44. The multiple types of push-up pots 50 are configured so that, for example, the outer diameters of push-up pins 52 are different from each other. Push-up pot 50 is detachably mounted on pot holding section 60. Push-up pot 50 mounted on pot holding section 60 is of a type corresponding to the size or the like of die 44 of wafer pallet 40 pulled out onto pallet pull-out table 33.

Pot station 37 is provided on the lower face of pallet pull-out table 33. Pot station 37 stores replacement push-up pots 50. Pot station 37 has multiple storage locations (four in FIG. 3) in which multiple push-up pots 50 can be stored. One of the multiple storage locations is unoccupied in order to store push-up pot 50 detached from pot holding section 60.

Each storage location of pot station 37 has recessed section 68 and lock pin fitting section 69. Recessed section 68 is a portion in which the barrel portion of pot main body 51 of push-up pot 50 fits. Lock pin fitting section 69 is a portion in which lock pin 58 of engagement member 57 of push-up pot 50 fits. Push-up pot 50 in pot station 37 is stored by engaging the upper face of flange section 55 of pot body 51 with the lower face of recessed section 68, by which the barrel portion of pot body 51 is fitted into recessed section 68, and engaging lock pins 58 of engagement member 57 with lock pin fitting section 69, so that pot body 51 of push-up pot 50 is held by the spring force of spring 59 with recessed section 68.

Push-up unit 34 is configured so that push-up pot 50 mounted on pot holding section 60 can be automatically exchanged. Automatic exchange of push-up pot 50 mounted on pot holding section 60 is performed by selecting push-up pot 50 in accordance with the size or the like of die 44 on dicing sheet 43.

Driving device 35 includes first Z-axis motor 35z1, second Z-axis motor 35z2, X-axis motor 35x, and Y-axis motor 35y. First Z-axis motor 35z1 is a motor that moves pot holding section 60 in the up-down direction (Z-direction) while pushing up push-up pin 52. Second Z-axis motor 35z2 is a motor that changes the distance between engaging block 63 and positioning block 61 by moving only engaging block 63 in the up-down direction during automatic exchange of push-up pot 50 mounted on pot holding section 60. X-axis motor 35x is a motor for moving pot holding section 60 in conveyance direction X. Y-axis motor 35y is a motor for moving pot holding section 60 in the Y-direction.

Control device 36 mainly consists of a computer provided with a CPU, ROM, RAM, and the like. Control device 36 is connected to first Z-axis motor 35z1, second Z-axis motor 35z2, X-axis motor 35x, and Y-axis motor 35y. Control device 36 drives motors 35z1, 35z2, 35x, 35y, individually, so that push-up pot 50 is moved to a desired position (i.e, an XYZ position). Each of motors 35z1, 35z2, 35x, 35y is individually driven in accordance with drive instructions from control device 36. When motors 35z1, 35z2, 35x, 35y are individually driven, pot holding section 60 and engaging block 63 are moved so that push-up pot 50 is moved to and held at the desired position.

When control device 36 is requested, by the control device of component mounting machine 1 or a factory server, to exchange push-up pot 50 to be mounted on pot holding section 60, control device 36 causes push-up pot 50 to be automatically exchanged. The automatic exchange of push-up pot 50 is executed by the control of driving device 35 of push-up unit 34 in the following manner. First, after push-up unit 34 is moved to the unlocking operational position, protrusion 67 is hooked by hook 11 as described above, and lock member 65 is rotated to the unlocked position. In this case, hook section 65a of lock member 65 disengages from lock pin 58 and lock pin 58 is unlocked.

Thereafter, second Z-axis motor 35z2 raises engaging block 63 of pot holding section 60 to shorten the distance between engaging block 63 of pot holding section 60 and positioning block 61 and compress spring 59. In this state, push-up pot 50 mounted on pot holding section 60 is moved to recessed section 68 of an unoccupied storage location of pot station 37, the barrel portion of push-up pot 50 pot body 51 is fitted into recessed section 68, and the upper face of flange section 55 of pot body 51 engages with the lower face of recessed section 68. In this state, engaging block 63 of pot holding section 60 is lowered by second Z-axis motor 35z2, and lock pins 58 of engagement member 57 fits into lock pin fitting section 69. In this way, push-up pot 50 is stored in pot station 37, and the storage state is held by the spring force of spring 59 of push-up pot 50.

Thereafter, push-up pot 50 to be used next is selected from the multiple push-up pots 50 stored in pot station 37. Pot holding section 60 is then moved to a position where push-up pot 50 is stored, positioning members 62 of positioning block 61 engage with the upper side of hooking pieces 56 of pot body 51 of push-up pot 50, and fitting recessed section 64 of engaging block 63 fits together with engagement member 57 of push-up pot 50. During this fitting, a vacuum pipe, one end of which is connected to a vacuum pump and the other end of which is opened to the bottom face of fitting recess 64 of engaging block 63, communicates with vacuum hole 54 of push-up pot 50.

In this state, engaging block 63 of pot holding section 60 is raised by second Z-axis motor 35z2 against the spring force of spring 59 of push-up pot 50. In the process of raising engaging block 63, first, since lock member 65 of engaging block 63 is in the locked position, the upper end portion of hook section 65a of lock member 65 abuts against lock pins 58. Since the upper edge of hook section 65a is an inclined surface, when the upper end of hook section 65a abuts against lock pin 58, lock member 65 rotates so as to escape toward the unlocked position in accordance with the ascent of hook section 65a. When lock member 65 rotates to the unlocked position, lock pin 58 slides down from the inclined surface of hook section 65a to the upper end of the side wall portion of fitting recessed section 64 of engaging block 63. When lock pin 58 reaches the upper end of the side wall portion of fitting recessed section 64, lock member 65 returns to the locked position due to the spring force, and lock pin 58 is locked by hook section 65a of lock member 65.

When engaging block 63 further continues to rise, lock pin 58 of push-up pot 50 is pushed up by the upper end of the side wall portion of fitting recessed section 64 of engaging block 63. When the pushing up is performed, lock pin 58 is extracted from lock pin fitting section 69. Thereafter, by moving pot holding section 60 in the Y direction, push-up pot 50 mounted on pot holding section 60 is removed from pot station 37, and engaging block 63 of pot holding section 60 is lowered to the original height position. This completes the automatic exchange of push-up pot 50.

Figure 8:
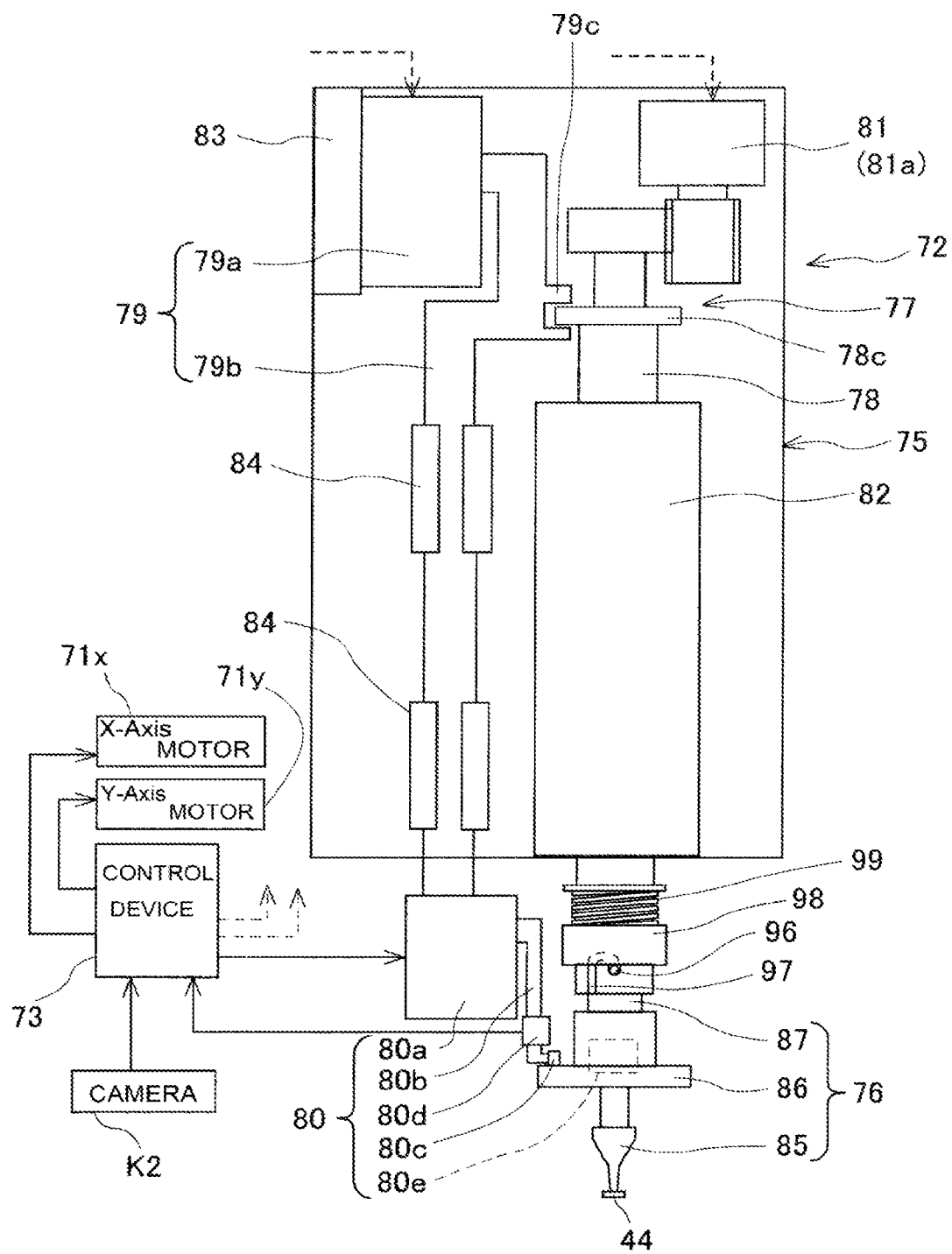
FIG. 8 A configuration diagram in which the vicinity of a mounting head is viewed from a horizontal direction, the mounting head being of a component transfer device provided in the component mounting machine of the embodiment.

Component transfer device 70 is a device for transferring die 44, supplied to the pickup position by component supply device 30, to the board positioned by board conveyance device 20. Specifically, component transfer device 70 picks up die 44, supplied to the pickup position, with the suction nozzle of the component mounting head, moves the suction nozzle above the positioned board, then moves the suction nozzle downward, releases the suction of the suction nozzle, and mounts die 44 to the mounting position on the board. As shown in FIGS. 2 and 8, component transfer device 70 includes XY robot 71, mounting head 72, control device 73, and nozzle station 74.

XY robot 71 is disposed vertically above board conveyance device 20. XY robot 71 is supported by an X-axis guide rail extending in board conveyance direction X of board conveyance device 20, and XY robot 71 is supported, integrally with the X-axis guide rail, by a Y-axis guide rail extending in orthogonal direction Y orthogonal to conveyance direction X. XY robot 71 can move in conveyance direction X along the X-axis guide rail by X-axis servomotor 71x and can be moved in orthogonal direction Y along the Y-axis guide rail by Y-axis servomotor 71y.

Mounting head 72 is attached to XY robot 71. Mounting head 72 is movable in both conveyance direction X and orthogonal direction Y by way of XY robot 71. Mounting head 72 includes head main body 75, suction nozzle 76, and nozzle lifting and lowering mechanism 77.

Head main body 75 is attached to main body section 10 of component mounting machine 1. Suction nozzle 76 is a nozzle for picking up die 44 by suction to its lower end, which is a nozzle tip, by introducing negative pressure or the like. Suction nozzle 76 picks up die 44 supplied to the pickup position of component supply device 30 by using negative pressure or the like and places the picked up die 44 on the mounting position of a board by releasing the suction. Mounting head 72 may be capable of simultaneously holding multiple suction nozzles 76.

Nozzle lifting and lowering mechanism 77 is a mechanism for moving suction nozzle 76 in the up-down direction with respect to head main body 75. Nozzle lifting and lowering mechanism 77 has lifting and lowering shaft 78. Lifting and lowering shaft 78 is a syringe that is held by head main body 75 and capable of being lifted and lowered and rotated about the Z-axis. Suction nozzle 76 is mounted on lifting and lowering shaft 78 such that suction nozzle 76 can be lifted and lowered.

Nozzle lifting and lowering mechanism 77 includes first lifting and lowering device 79, second lifting and lowering device 80, and rotating device 81. First lifting and lowering device 79 lifts and lowers lifting and lowering shaft 78 with respect to head main body 75. First lifting and lowering device 79 includes first linear motor 79a, first lifting driving member 79b, and the like. Second lifting and lowering device 80 lifts and lowers suction nozzle 76 with respect to lifting and lowering shaft 78. Second lifting and lowering device 80 includes second linear motor 80a, second lifting and lowering driving member 80b, roller 80c, load cell 80d, biasing spring 80e, and the like. Rotating device 81 rotates lifting and lowering shaft 78 with respect to head main body 75. Rotating device 81 includes rotation motor 81a and the like.

Head main body 75 includes shaft holding section 82, motor holding section 83, guide 84, and rotation motor 81a. Shaft holding section 82 holds lifting and lowering shaft 78 so that lifting and lowering shaft can be lifted and lowered as well as rotated. Motor holding section 83 holds first linear motor 79a in a fixed manner. A pair of guides 84 is provided and guides the lifting and lowering of first lifting and lowering driving member 79b.

Figure 9:
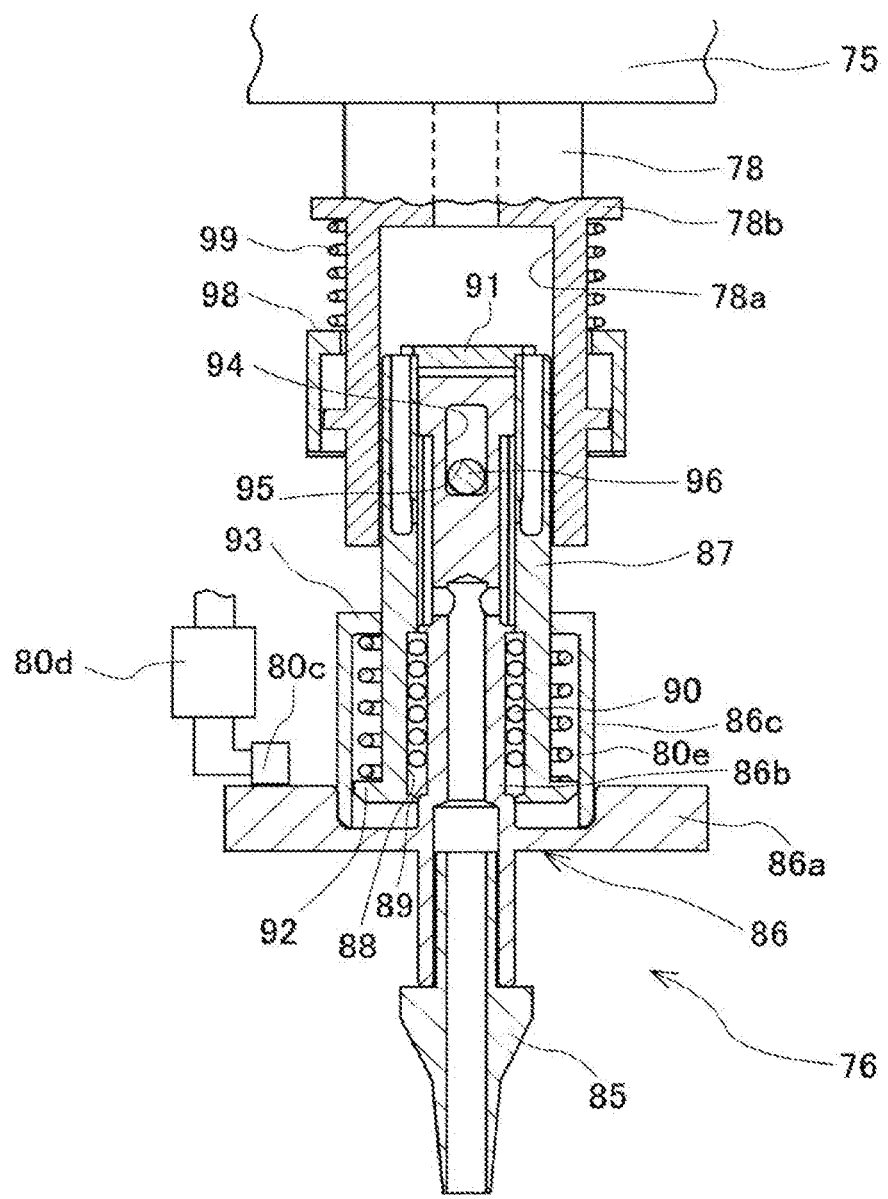
FIG. 9 A partial cross-sectional view of a suction nozzle of the mounting head included in the component transfer device of the embodiment in which the vicinity of the suction nozzle is viewed from a horizontal direction.
Figure 10:
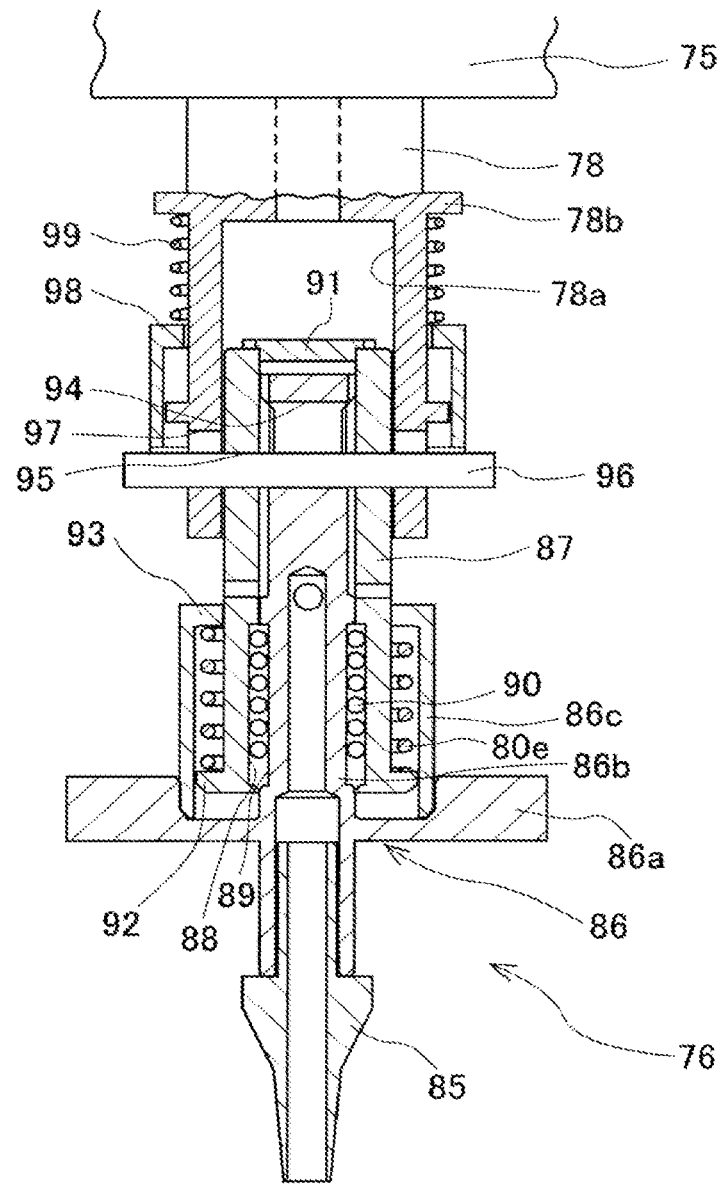
FIG. 10 A partial cross-sectional view of the suction nozzle of the mounting head included in the component transfer device of the embodiment in which the vicinity of the suction nozzle is viewed from a horizontal direction shifted by 90 degrees in the circumferential direction from the horizontal direction in FIG. 9.

Suction nozzle 76 has nozzle section 85, flange section 86, and holder section 87. Suction nozzle 76 is mounted on lifting and lowering shaft 78 in a detachable (exchangeable) manner. Nozzle section 85 has a tubular shape and is capable of picking up die 44 by suction at the lower end. As shown in FIGS. 9 and 10, flange section 86 includes circular plate section 86a, shaft section 86b, and spring holding tube 86c. Shaft section 86b is formed integrally with circular plate section 86a and penetrates through the center of circular plate section 86a. Nozzle section 85 is fitted into the lower end of shaft section 86b. Spring holding tube 86c has a cylindrical shape and is attached to the upper face of circular plate section 86a.

Holder section 87 has a hollow cylindrical shape. Bearing groove 88 extending along the axial direction is formed in the lower inner wall of holder section 87. Bearing groove 89 extending along the axial direction is formed in the outer wall of shaft section 86b above circular plate section 86a. Bearing 90 is fitted between bearing groove 88 of holder section 87 and bearing groove 89 of shaft section 86b. Flange section 86 is held so as to be able to move up and down with respect to holder section 87.

Lid 91 is attached to the upper end of holder section 87. The upper portion of holder section 87 is inserted into attachment hole 78a that opens downward to the lower end of lifting and lowering shaft 78. Holder section 87 is detachably attached to lifting and lowering shaft 78 with its upper portion inserted into attachment hole 78a. Holder section 87 is fitted into lifting and lowering shaft 78 with a clearance via an O-ring or the like. The O-ring may be interposed between holder section 87 of suction nozzle 76 and lifting and lowering shaft 78. The lower outer periphery of holder section 87 is covered with spring holding tube 86c of flange section 86. Outer flange section 92 protruding radially outward is provided at the lower end of holder section 87. Inner flange section 93 protruding radially inward is provided the upper end of spring holding tube 86c. Biasing spring 80e is disposed between outer flange section 92 of holder section 87 and inner flange section 93 of spring holding tube 86c. Biasing spring 80e is a compression coil spring supported at both ends by outer flange section 92 and inner flange section 93.

Elongated hole 94 is provided in the upper portion of shaft section 86b of flange section 86. Elongated hole 94 penetrates the side wall of shaft section 86b and extends in the vertical direction. Holder section 87 has a pair of holes 95 at positions facing elongated hole 94 of shaft section 86b. Locking pin 96 is inserted through elongated hole 94 and the pair of holes 95. Locking pin 96 is fixed to holder section 87.

A pair of J slots 97 are provided on the side wall at the lower end of lifting and lowering shaft 78. The pair of J slots 97 face each other with the axial center of lifting and lowering shaft 78 interposed therebetween. Each J slot 97 is opened at the lower end of lifting and lowering shaft 78 and is formed in a J-shape extending upward from the opening, then in the circumferential direction, and then slightly extending downward. Both ends of locking pin 96 protruding from holder section 87 are engaged with the pair of J slots 97.

Locking ring 98 and coil spring 99 are fitted on the outer periphery of the lower end of lifting and lowering shaft 78. Outer flange section 78b projecting radially outward is provided at the central portion of lifting and lowering shaft 78. Coil spring 99 is a compression coil spring disposed between the upper face of locking ring 98 and outer flange section 78b of lifting and lowering shaft 78. In a state in which suction nozzle 76 is not mounted on lifting and lowering shaft 78, locking ring 98 is positioned at a position where the gravitational force of locking ring 98 and the urging force of coil spring 99 balance each other with respect to lifting and lowering shaft 78.

Suction nozzle 76 is mounted on lifting and lowering shaft 78 by fixing the engagement of locking pin 96 with J slot 97 according to the following procedure. First, the upper portion of holder section 87 of suction nozzle 76 is inserted into attachment hole 78a of lifting and lowering shaft 78, locking pin 96 is inserted into and engaged with J slot 97 of lifting and lowering shaft 78 from below, and is moved to the innermost portion thereof along the extending direction of J slot 97. During the process of moving locking pin 96, locking pin 96 abuts against the lower face of locking ring 98 and pushes up locking ring 98 against the spring force of coil spring 99. Thereafter, locking pin 96 reaches a seating portion at the innermost portion of J slot 97. When locking pin 96 reaches the seating portion of J slot 97, locking pin 96 is pressed downward by the lower face of locking ring 98 by the spring force of coil spring 99. By fixing the engagement of locking pin 96 with J slot 97 with the pressing force of coil spring 99, suction nozzle 76 is mounted on lifting and lowering shaft 78.

Suction nozzle 76 is detached from lifting and lowering shaft 78 by releasing the engagement of locking pin 96 from J slot 97 according to the following procedure. First, locking pin 96 of suction nozzle 76 pushes locking ring 98 upward against the spring force of coil spring 99 from the seating portion of J slot 97 and is moved to the opening thereof along the extending direction of J slot 97. During the movement of locking pin 96, the spring force of coil spring 99 acting on locking pin 96 becomes zero. As a result, locking pin 96 disengages from J slot 97 and releases the insertion of the upper portion of holder section 87 from attachment hole 78a of lifting and lowering shaft 78, causing suction nozzle 76 to detach from lifting and lowering shaft 78.

Holder section 87 is restricted from moving up and down and is also restricted from rotating with respect to lifting and lowering shaft 78. On the other hand, flange section 86 can be moved up and down with respect to holder section 87 and thus lifting and lowering shaft 78 by the movable range of locking pin 96 in elongated hole 94, that is, the difference between the length of elongated hole 94 and the diameter of locking pin 96. Biasing spring 80e urges flange section 86 upward with respect to holder section 87 and thus lifting and lowering shaft 78. As a result, flange section 86 is positioned at the upper end of the above-mentioned movable range.

In nozzle lifting and lowering mechanism 77, first lifting and lowering driving member 79b is attached to first linear motor 79a. First lifting and lowering driving member 79b extends in the Z-direction alongside the axis of lifting and lowering shaft 78, outside shaft holding section 82 of head main body 75. Engaging section 79c is provided at a central portion of first lifting and lowering driving member 79b in the up-down direction. Engaging section 79c engages with flange section 78c of lifting and lowering shaft 78. Second linear motor 80a is held at the lower end of first lifting and lowering driving member 79b. First linear motor 79a is capable of lifting and lowering both lifting and lowering shaft 78 and second linear motor 80a with first lifting and lowering driving member 79b.

Second lifting and lowering driving member 80b is attached to second linear motor 80a. Second lifting and lowering driving member 80b extends in the Z-axis direction alongside the axis of suction nozzle 76. Load cell 80d is disposed at a central portion of second lifting and lowering driving member 80b in the up-down direction. Roller 80c is rotatably held at the lower end of second lifting and lowering driving member 80b. Roller 80c is in contact with the upper face of circular plate section 86a of flange section 86. Second linear motor 80a can lift and lower both load cell 80d and roller 80c with second lifting and lowering driving member 80b.

Second linear motor 80a can press, with roller 80c, the upper face of circular plate section 86a of flange section 86 downward against the urging force of biasing spring 80e. When the pressure by roller 80c is generated, flange section 86 is lowered with respect to holder section 87. When the pressing force at roller 80c becomes small, flange section 86 is raised with respect to holder section 87 by the urging force of biasing spring 80e. That is, second linear motor 80a lifts and lowers suction nozzle 76 with respect to lifting and lowering shaft 78. Load cell 80d detects a pressing force in the Z-direction when roller 80c presses circular plate section 86a. The detected pushing force of load cell 80d is the sum of the upward force acting on suction nozzle 76 by the urging force of biasing spring 80e and the upward force acting on suction nozzle 76 from the board via die 44 when die 44 is being mounted on a board.

The rotation of rotation motor 81a is transmitted to lifting and lowering shaft 78 while allowing lifting and lowering shaft 78 to move up and down. Lifting and lowering shaft 78 rotates via the rotation of rotation motor 81a. The rotation of lifting and lowering shaft 78 is transmitted to suction nozzle 76 through the engagement between locking pin 96 and J slot 97 in addition to bearing 90. Suction nozzle 76 is rotated by the rotation of lifting and lowering shaft 78.

Mounting head 72 performs the following operation so that when die 44 picked up by suction nozzle 76 is mounted on a board, an impact due to excessive force is not applied to die 44. Specifically, first, first lifting and lowering driving member 79b is lowered by the driving of first linear motor 79a, causing lifting and lowering shaft 78 and second linear motor 80a to be lowered. Further, second lifting and lowering driving member 80b and roller 80c are lowered by the driving of second linear motor 80a, causing suction nozzle 76 to be pressed and lowered. In this operation, the rotational orientation of die 44 picked up by suction nozzle 76 may be changed or corrected by rotation motor 81a rotating lifting and lowering shaft 78 and thus suction nozzle 76 as necessary.

Multiple types of suction nozzles 76 are provided in accordance with the size and type of die 44. The multiple types of suction nozzles 76 are configured such that, for example, the outer diameters of suction nozzles 76 are different from each other. Suction nozzle 76 is detachably mounted on lifting and lowering shaft 78.

Suction nozzle 76 mounted on lifting and lowering shaft 78 is of a type corresponding to the size or the like of die 44 pushed up by push-up pin 52 of push-up pot 50.

Nozzle station 74 is provided between board transfer device 20 and component supply device 30. Nozzle station 74 stores replacement suction nozzles 76. Nozzle station 74 has storage container 74a having a substantially rectangular shape. Storage container 74a has multiple nozzle storage holes for storing multiple suction nozzles 76. One of the multiple nozzle accommodating holes is available to store suction nozzle 76 detached from lifting and lowering shaft 78.

Mounting head 72 is configured to automatically exchange suction nozzle 76 mounted on head main body 75. Automatic exchange of suction nozzle 76 mounted on head main body 75 is performed by selecting suction nozzle 76 in accordance with the size of die 44 to be picked up or the like.

Control device 73 mainly includes a computer provided with a CPU, a ROM, a RAM, and the like. Control device 73 is connected to X-axis servomotor 71x, Y-axis servomotor 71y, first linear motor 79a, second linear motor 80a, load cell 80d, and rotation motor 81a. Control device 73 drives motors 71x, 71y, 79a, 80a, 81a, individually, so that suction nozzle 76 is moved to a desired position (i.e., an XYZ position). Each of motors 71x, 71y, 79a, 80a, 81a is driven in accordance with drive instructions from control device 73. When motors 71x, 71y, 79a, 80a, 81a are individually driven, XY robot 71 and head main body 75 are moved so that suction nozzle 76 is moved to and held at the desired position.

When a request from the control device of component mounting machine 1 or a factory server is received by control device 73 to exchange suction nozzle 76, to be mounted on mounting head 72, control device 73 causes suction nozzle 76 to be automatically exchanged. The automatic exchange of suction nozzle 76 is executed by the control of XY robot 71 and nozzle lifting and lowering mechanism 77 in the following manner.

First, mounting head 72 moves above the available nozzle accommodation hole of accommodation container 74a of nozzle station 74 by way of XY robot 71 moving in the XY plane. Then, lifting and lowering shaft 78 is lowered by nozzle lifting and lowering mechanism 77, causing suction nozzle 76 currently mounted on mounting head 72 to be delivered to an unoccupied nozzle accommodating hole. Next, XY robot 71 is moved in the XY plane while lifting and lowering shaft 78 is lifted by nozzle lifting and lowering mechanism 77, causing mounting head 72 to be moved above the nozzle accommodating hole on which suction nozzle 76 to be mounted is accommodated. Nozzle lifting and lowering mechanism 77 lowers lifting and lowering shaft 78, causing suction nozzle 76 accommodated in the nozzle accommodating hole to mounted on mounting head 72. After suction nozzle 76 is mounted, lifting and lowering shaft 78 is lifted by nozzle lifting and lowering mechanism 77. This completes the automatic exchange of suction nozzle 76.

Camera K1 is attached to XY robot 71. Camera K1 captures from above an image of die 44 on dicing sheet 43 or die 44 pushed up by push-up pot 50 and acquires positional information of die 44. This positional information is used for position control and orientation control of suction nozzle 76 when die 44 supplied to the pickup position by component supply device 30 is picked up by suction nozzle 76 of mounting head 72.

Camera K2 is attached to main body section 10 of component mounting machine 1. Camera K2 can capture an image from below of die 44 picked up by suction nozzle 76 and acquire positional information of die 44. This positional information is used for positional and orientation control of suction nozzle 76 when die 44 picked up by suction nozzle 76 is mounted on a board. In addition, camera K2 can capture an image of suction nozzle 76 after exchanging suction nozzle 76 mounted on lifting and lowering shaft 78 of mounting head 72 and acquire information on the mounting position of suction nozzle 76 with respect to lifting and lowering shaft 78. This positional information is used to control the operation of improving the seating of suction nozzle 76 with respect to lifting and lowering shaft 78, as will be described in detail later. The imaging information of camera K2 is supplied to control device 73.

Camera K3 is attached to main body section 10 of component mounting machine 1, magazine holding section 32 of component supply device 30, or the like. Camera K3 can capture an image of push-up pot 50 after exchanging push-up pot 50 mounted on pot holding section 60 and acquire information on the mounting position of push-up pot 50 with respect to pot holding section 60. This positional information is used to control the operation of improving the seating of push-up pot 50 with respect to pot holding section 60, as will be described in detail later. The imaging information of camera K3 is supplied to control device 36.

2. Operation of the Component Mounting Machine after Exchanging the Push-Up Pot or the Suction Nozzle In component mounting machine 1 having the above-described structure, pot holding section 60 can be moved in the XYZ direction with driving device 35 in a state in which push-up pot 50 of push-up unit 34 is mounted. Push-up pot 50 mounted on pot holding section 60 can be exchanged with replacement push-up pot 50 stored in pot station 37. Push-up pot 50 is positioned and held by engaging hooking pieces 56 with positioning members 62 of positioning block 61 of pot holding section 60. At the time of this positioning, engagement member 57 of push-up pot 50 is fitted into fitting recessed section 64 of engaging block 63.

Mounting head 72 can be moved in the XY direction by XY robot 71 while suction nozzle 76 is mounted, and suction nozzle 76 is mounted on lifting and lowering shaft 78 such that suction nozzle 76 can be lifted and lowered with respect to head main body 75, by first linear motor 79a of nozzle lifting and lowering mechanism 77, and rotated around the Z-axis by rotation motor 81a. Suction nozzle 76 mounted on mounting head 72 can be exchanged with replacement suction nozzle 76 stored in nozzle station 74. Suction nozzle 76 is positioned and held by locking pin 96, fixed to holder section 87, being locked to the seating portion at the innermost portion of J slot 97 of lifting and lowering shaft 78.

When push-up pot 50 or suction nozzle 76 is exchanged as described above, the seating of push-up pot 50 with respect to pot holding section 60, or the seating of suction nozzle 76 with respect to lifting and lowering shaft 78, may not be stable. If the seating is not stable, the position where die 44 is held on push-up pot 50 or suction nozzle 76 may change before or after die 44 is held. Therefore, after the above exchange and before die 44 is held by push-up pot 50 or suction nozzle 76, it is important to stabilize the seating of push-up pot 50 with respect to pot holding section 60, or the seating of suction nozzle 76 with respect to lifting and lowering shaft 78.

In component mounting machine 1, after the exchange of push-up pot 50 mounted on pot holding section 60 is performed, control device 36 of component supply device 30 executes a seating improvement process for improving the seating of push-up pot 50 with respect to pot holding section 60 before push-up pin 52 of push-up pot 50 pushes up die 44 of dicing sheet 43 to hold die 44.

In the seating improvement process of push-up pot 50 described above, a force is applied to pot holding section 60 in a predetermined direction including the horizontal direction so as to improve the seating of push-up pot 50 with respect to pot holding section 60 in which push-up pot 50 is mounted. The seating improvement process by control device 36 is performed by moving pot holding section 60 with X-axis motor 35x and Y-axis motor 35y of driving device 35 in order to improve the seating of push-up pot 50 with respect to pot holding section 60. The predetermined direction should include at least the horizontal direction, and may include the up-down direction, but it is preferable that the force of the horizontal direction component is predominantly large. When the predetermined direction includes the up-down direction, pot holding section 60 is moved using first Z-axis motor 35z1 of driving device 35.

The moving operation of pot holding section 60 for improving the seating in the seating improvement process described above (hereinafter, referred to as a seating improvement moving operation) is performed separately from the moving operation of pot holding section 60 (hereinafter, referred to as a normal moving operation) for pushing up die 44 of dicing sheet 43 with push-up pin 52 of push-up pot 50. This seating improvement moving operation is preferably performed before the normal moving operation is started, but may be performed after the normal moving operation is completed and before die 44 is pushed up.

The seating improvement moving operation of pot holding section 60 is a moving operation accompanied by acceleration and deceleration so that a force is applied to pot holding section 60 in a predetermined direction including the horizontal direction, and is, for example, a linear reciprocating movement between two points, a sequential movement between multiple points performed so that a force is uniformly applied horizontally 360°, a circular movement or a spiral movement performed without changing the radial direction of pot holding section 60, or the like. In order to improve the seating improvement effect, it is preferable that the sitting improvement moving operation is repeated multiple times. For example, in the case of linear reciprocating movement between two points, in which a cycle consists of a single reciprocation to one point and back, it is preferable to repeat the cycle multiple times, in other words, to vibrate. Further, in the case of circular motion, it is preferable to repeat the circular motion multiple times, that is, with each time consisting of one full rotation. When the seating improvement moving operation is repeated multiple times as described above, it is more preferable to have larger numbers of repetitions. Further, the seating improvement moving operation may consist of, for example, a predetermined multiple number of reciprocations instead of one reciprocation as described above, or a predetermined multiple number of rotations instead of one rotation as described above.

When X-axis motor 35*x* and Y-axis motor 35*y* of driving device 35 are driven by the seating improvement process of control device 36, pot holding section 60 performs the seating improvement moving operation accompanied by acceleration and deceleration, causing a force to be applied to pot holding section 60 in a predetermined direction including the horizontal direction. When a force is applied to pot holding section 60 in a predetermined direction including the horizontal direction, pot holding section 60 and push-up pot 50 mounted on pot holding section 60 can move relative to each other by the action of the force applied to pot holding section 60. Therefore, the fitting state of fitting recessed section 64 of pot holding section 60 and engagement member 57 of push-up pot 50 is improved to a state in which the positional relationship between them, particularly in the horizontal direction, is stabilized; and the engagement state of positioning member 62 of pot holding section 60 and engaging piece 56 of push-up pot 50 is improved to a state in which the positional relationship between them, particularly in the horizontal direction, is stabilized. For example, even when push-up pot 50 is mounted on pot holding section 60 with an angular deviation or an offset deviation from a desired position, the angular deviation or the offset deviation is eliminated. Further, as the number of times of application of the above-mentioned force increases or as the above-mentioned time of application of the force increases, the improvement thereof is accelerated.

In component mounting machine 1, after suction nozzle 76 mounted on lifting and lowering shaft 78 of mounting head 72 is exchanged, control device 73 of component transfer device 70 executes a seating improvement process of suction nozzle 76 with respect to lifting and lowering shaft 78 before nozzle section 85 of suction nozzle 76 picks up and holds die 44 by suction to the lower end with negative pressure or the like.

In the seating improvement process of suction nozzle 76 described above, a force is applied to lifting and lowering shaft 78 in a predetermined direction including the horizontal direction in order to improve the seating of suction nozzle 76 with respect to lifting and lowering shaft 78 on which suction nozzle 76 is mounted. The seating improvement process by control device 73 is performed by moving lifting and lowering shaft 78 with X-axis servomotor 71*x* and Y-axis servomotor 71*y* of XY robot 71 in order to improve the seating of suction nozzle 76 with respect to lifting and lowering shaft 78. The predetermined direction should include at least the horizontal direction, and may include the up-down direction, but it is preferable that the force of the horizontal direction component is predominantly large. When the predetermined direction includes the up-down direction, first linear motor 79*a* of first lifting and lowering device 79 is also used to move lifting and lowering shaft 78.

The seating improvement moving operation of lifting and lowering shaft 78 for improving the seating described above is performed separately from the normal moving operation of lifting and lowering shaft 78 for picking up die 44, pushed up by push-up pin 52, with the tip of suction nozzle 76. The seating improvement moving operation is preferably performed before the normal moving operation is started, but may be performed after the normal moving operation is finished but before die 44 is picked up by suction.

The seating improvement moving operation of lifting and lowering shaft 78 is a moving operation accompanied by acceleration and deceleration so that a force is applied to lifting and lowering shaft 78 in a predetermined direction including the horizontal direction, and is, for example, a reciprocating movement between two points, a sequential movement between multiple points performed so that a force is uniformly applied horizontally 360°, a circular movement or a spiral movement performed without changing the radial direction of lifting and lowering shaft 78, or the like. In order to improve the seating improvement effect, it is preferable that the sitting improvement moving operation is repeated multiple times. For example, in the case of a reciprocating movement between two points, in which a cycle consists of a single reciprocation to one point and back, it is preferable to repeat the cycle multiple times, in other words, to vibrate. Further, in the case of circular motion, it is preferable to repeat the circular motion multiple times, that is, with each time consisting of one full rotation. When the seating improvement moving operation is repeated multiple times as described above, it is more preferable to have larger numbers of repetitions. Further, the seating improvement moving operation may consist of, for example, a predetermined multiple number of reciprocations instead of one reciprocation as described above, or a predetermined multiple number of rotations instead of one rotation as described above.

When X-axis servomotor 71*x* and Y-axis servomotor 71*y* of XY robot 71 are driven by the seating improvement process of control device 73, lifting and lowering shaft 78 performs the seating improvement moving operation accompanied by acceleration and deceleration, causing a force to be applied to lifting and lowering shaft 78 in a predetermined direction including the horizontal direction. When a force is applied to lifting and lowering shaft 78 in a predetermined direction including the horizontal direction, lifting and lowering shaft 78 and suction nozzle 76 mounted on lifting and lowering shaft 78 can move relative to each other by the action of the force applied to lifting and lowering shaft 78 so that the engagement state between J slot 97 of lifting and lowering shaft 78 and locking pin 96 of suction nozzle 76 is improved to a state in which the positional relationship between J slot 97 of lifting and lowering shaft 78 and suction nozzle 76 is stabilized particularly in the horizontal direction. For example, even when suction nozzle 76 is mounted on lifting and lowering shaft 78 with an angular deviation or an offset deviation from a desired position, the angular deviation or the offset deviation is eliminated. Further, as the number of times of application of the above-mentioned force increases or as the above-mentioned time of application of the force increases, the improvement thereof is accelerated.

As described above, with component mounting machine 1 of the present embodiment, when push-up pot 50 mounted on pot holding section 60 is exchanged, after the exchange, the seating improvement moving operation of driving device 35 can stabilize the seating of push-up pot 50 with respect to pot holding section 60, particularly in the horizontal direction, by the of driving device 35 before push-up pin 52 of push-up pot 50 pushes up die 44 of dicing sheet 43 and holds die 44. When suction nozzle 76 mounted on lifting and lowering shaft 78 of mounting head 72 is exchanged, the seating improvement moving operation of XY robot 71 can stabilize the seating of suction nozzle 76 with respect to lifting and lowering shaft 78, particularly in the horizontal direction, before nozzle section 85 of suction nozzle 76 picks up and holds die 44 after the exchange.

Therefore, it is possible to improve the positioning accuracy of push-up pot 50 or suction nozzle 76 after an exchange, thereby making it possible to suppress positional deviation when the tip of push-up pin 52 of push-up pot 50 or the tip of nozzle section 85 of suction nozzle 76 holds die 44 after the normal moving operation (specifically, pushing up or picking up by suction), and hold die 44 at a position with high accuracy with push-up pot 50 or suction nozzle 76 after the exchange.

In the above embodiment, main body section 10 of component mounting machine 1 corresponds to the "component mounting machine main body", pot holding section 60 or lifting and lowering shaft 78 corresponds to the "mounting base", die 44 corresponds to the "component", push-up pot 50 or suction nozzle 76 corresponds to the "mounting/demounting tool, first and second Z-axis motors 35z1, 35z2 of driving device 35 or nozzle lifting and lowering mechanism 77 correspond to the "tool moving mechanism", X-axis motor 35x and Y-axis motor 35y of driving device 35 correspond to the "mounting base moving mechanism", and control devices 36, 73 correspond to the "control device".

3. Modifications 3-1. First Modification

In the seating improvement process of push-up pot 50 and suction nozzle 76 of the above embodiment, the seating improvement moving operation of pot holding section 60 and lifting and lowering shaft 78 is executed one or more times. However, in the configuration in which the seating improvement moving operation is repeated multiple times, if the number of times is set to an excessively large value, the seating improvement moving operation may be executed unnecessarily even after the seating of push-up pot 50 or suction nozzle 76 is sufficiently stabilized. On the other hand, if the number of times is set to an excessively small value, the seating improvement moving operation may be completed before the seating of push-up pot 50 or suction nozzle 76 is sufficiently stabilized. Therefore, it is desirable to sufficiently stabilize the seating of push-up pot 50 and suction nozzle 76 without unnecessarily executing the seating improvement moving operation of pot holding section 60 and lifting and lowering shaft 78.

Control devices 36, 73 of component mounting machine 1 repeatedly execute the seating improvement moving operation of pot holding section 60 or lifting and lowering shaft 78 a predetermined multiple number of times, respectively, and acquire an image with cameras K2, K3, before and after each time the seating improvement moving operation is executed, for the purpose of determining whether the mounting position of push-up pot 50 or suction nozzle 76 has converged with respect to pot holding section 60 or lifting and lowering shaft 78 hold section. Then, based on the imaging result, a number of repetitions of the seating improvement moving operation for determining whether the seating is stable may be selected, and the predetermined multiple number of times for repeating the seating improvement moving operation is updated for the next time.

Figure 11:
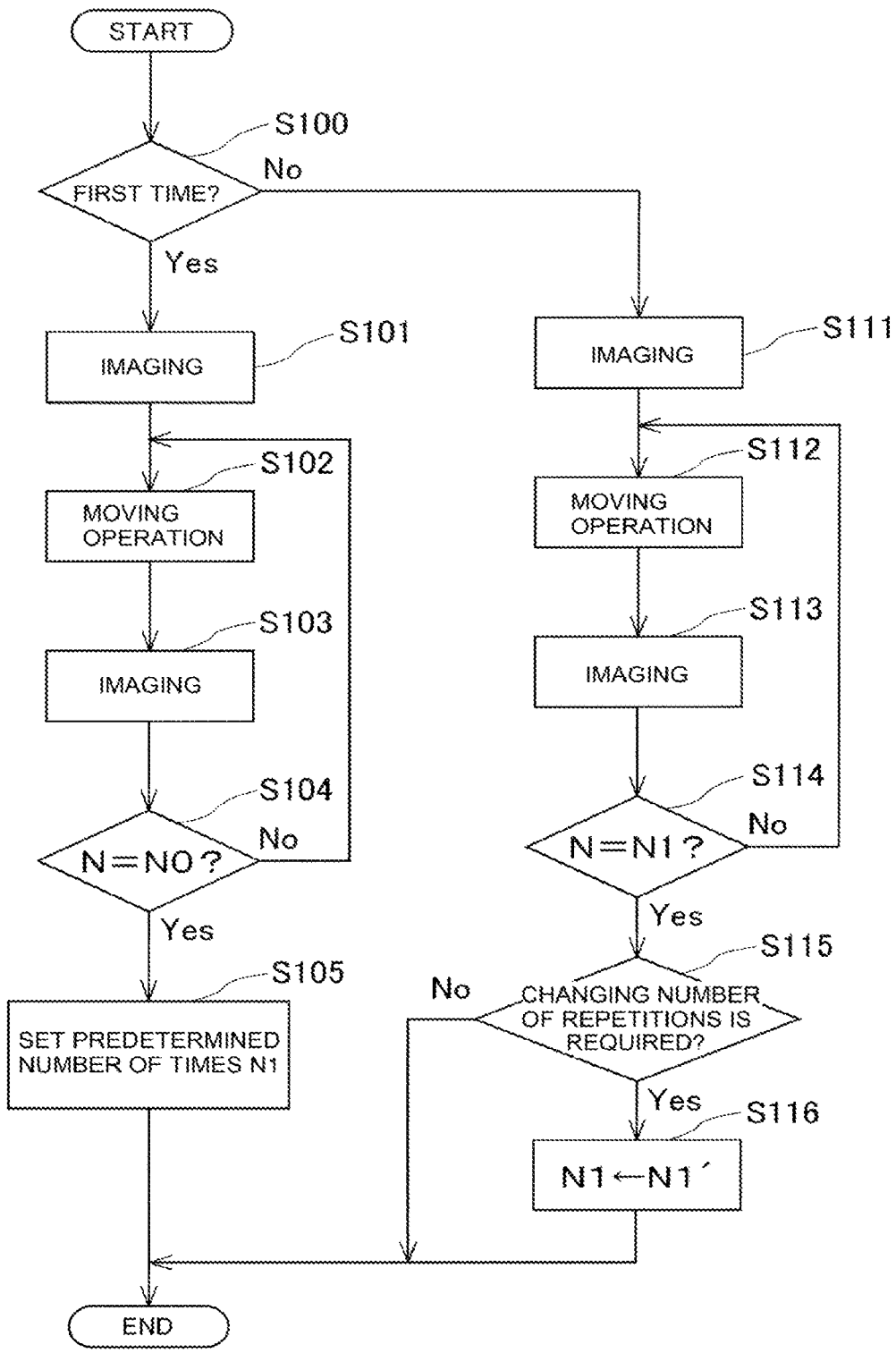
FIG. 11 A flowchart of an example of a control routine executed in the component mounting machine according to a first modification.

More specifically, each of control devices 36, 73 executes the control routine shown in FIG. 11 when push-up pot 50 or suction nozzle 76 is exchanged after restarting or starting up, such as when the power of component mounting machine 1 is turned on or when the door is opened for manual operation by an operator. Hereinafter, push-up pot 50 and suction nozzle 76 may be collectively referred to as mounting/demounting tools 50, 76, and pot holding section 60 and lifting and lowering shaft 78 may be collectively referred to as mounting bases 60, 78.

When mounting/demounting tools 50, 76 corresponding to mounting bases 60, 78 are exchanged, control devices 36, 73 determine whether exchanged mounting/demounting tools 50, 76 are mounting/demounting tools for seating and performing the improvement process for the first time (step S100). The determination as to whether the seating improvement process is performed for the first time may be performed for each of mounting/demounting tools 50, 76. That is, the determination result may be different for each individual tool even for the same type of mounting/demounting tools 50, 76.

When control devices 36, 73 determine that mounting/demounting tools 50, 76 are mounting/demounting tools for performing the seating improvement process for the first time by the process of step S100, control devices 36, 73 first use cameras K2, K3 to image the installation position of push-up pot 50 or suction nozzles 76 with respect to pot holding section 60 or lifting and lowering shaft 78 after exchanging mounting/demounting tools 50, 76 (step S101). Next, X-axis motor 35x and Y-axis motor 35y of driving device 35 or X-axis servomotor 71x and Y-axis servomotor 71y of XY robot 71 perform the seating improvement moving operation of pot holding section 60 or lifting and lowering shaft 78 once (step S102). Then, after the seating improvement moving operation is completed once, the mounting position of push-up pot 50 or suction nozzle 76 with respect to pot holding section 60 or lifting and lowering shaft 78 is imaged with cameras K2, K3 (step S103).

Next, after the present seating improvement process is started, control devices 36, 73 determine whether number N of times the seating improvement moving operation of pot holding section 60 or lifting and lowering shaft 78 has been executed has reached the initial number N0 (step S104). The initial number of times N0 is an initial value, determined in advance based on a test result or the like, corresponding to the number of repetitions of the seating improvement moving operation that can stabilize the seating of push-up pot 50 or suction nozzle 76 and is set to "2" or more times and stored in memory. The initial number of times N0 is preferably set to a large number of times so that the seating of push-up pot 50 or suction nozzle 76 can be reliably stabilized. The initial number of times N0 may be set for each type of mounting/demounting tools 50, 76.

Then, when it is determined that the relationship of N=N0 is not established by the process of step S104, that is, the relationship of N<N0 is established, control devices 36, 73 repeatedly execute the process of step S102 to execute the seating improvement moving operation again. On the other hand, when it is determined that the relationship of N=N0 is established by the process of above-mentioned step S104, next, a predetermined number of times N1 for executing the seating improvement moving operation of pot holding section 60 or lifting and lowering shaft 78 during the next (specifically, the second) execution of the seating improvement process of mounting/demounting tools 50, 76 is set (step S105). The determined predetermined number of times N1 is stored in the memory of control devices 36, 73. After control devices 36, 73 determines the predetermined number of times N1, the present routine is terminated.

The setting of the predetermined number of times N1 is performed as described below based on the imaging results of the mounting positions of mounting/demounting tools 50, 76 obtained by the process of above-described steps S101, S103. That is, first, control devices 36, 73 calculate the change amount P1 between the mounting positions of mounting/demounting tools 50, 76 before and after the execution of the first seating improvement moving operation based on the imaging result obtained by the process of step S101 (hereinafter, referred to as the initial imaging result) and the imaging result obtained by the process of step S103 after the first seating improvement moving operation (hereinafter, referred to as the first imaging result). Further, based on the first imaging result and the imaging result obtained by the process of above-described step S103 after the second seating improvement moving operation, the change amount P2 between the mounting positions of mounting/demounting tools 50, 76 before and after the execution of second seating improvement moving operation is calculated. Then, the change amounts P1, . . . , PN0 of the mounting positions of mounting/demounting tools 50, 76 are calculated for the initial number of times N0 the seating improvement moving operation is executed.

Then, control devices 36, 73 select the number of times of the seating improvement moving operation at which convergence of the mounting position is indicated, based on the change amounts P1, . . . , PN0 of the mounting positions of mounting/demounting tools 50, 76 calculated as described above, and sets that number of times, at which the mounting position has converged, as the predetermined number of times N1. For example, a number larger than the smallest number of repetitions, among the above-mentioned change amounts P1, . . . , PN0, at which the change amount is sufficiently close to zero while holding die 44, is set as the predetermined number of times N1.

When the same mounting/demounting tools 50, 76 are installed by exchanging after the process of step S105, control devices 36, 73 determine that mounting/demounting tools 50, 76 are not mounting/demounting tools for which the seating improvement process is executed for the first time in step S100. When this determination is made, after the exchange, the mounting positions of mounting/demounting tools 50, 76 with respect to mounting bases 60, 78 are imaged by using cameras K2, K3 (step S111). Next, X-axis motor 35x and Y-axis motor 35y of driving device 35 or X-axis servomotor 71x and Y-axis servomotor 71y of XY robot 71 perform the seating improvement moving operation of mounting bases 60, 78 once (step S112). Then, after the seating improvement moving operation is completed once, the mounting positions of mounting/demounting tools 50, 76 with respect to mounting bases 60, 78 are imaged by using cameras K2, K3 (step S113).

Next, after the present seating improvement process is started, control devices 36, 73 determine whether the number N of times the seating improvement moving operation of mounting platforms 60, 78 is executed has reached the predetermined number N1 of times set for each of mounting/demounting tools 50, 76 in the above-described step S105 (step S114). If it is determined that the relationship of N=N1 is not established, that is, the relationship of N<N1 is established, the process of the above-mentioned step S112 is repeated, and the seating improvement moving operation is executed again. On the other hand, when it is determined that the relationship of N=N1 is established, it is next determined whether it is necessary to change the predetermined number of repetitions N1 by which the seating of mounting bases 60, 78 is to be performed when the next seating improvement process of mounting/demounting tools 50, 76 is performed based on whether the seating of mounting/demounting tools 50, 76 is sufficiently stabilized by the predetermined number of repetitions N1 (step S115). The determination of the necessity for changing the predetermined number of repetitions N1 is performed as described below based on the imaging results of the mounting positions of mounting/demounting tools 50, 76 obtained by the process of above-described steps S111, S113.

For example, control devices 36, 73 determine whether the predetermined number of repetitions N1 needs to be changed (specifically, increased) based on whether the change amount PN1 between the mounting positions of mounting/demounting tools 50, 76 before and after the last seating improvement moving operation among the predetermined number of repetitions N1 of the seating improvement moving operation is sufficiently close to zero while holding die 44. When the change quantity PN1 is close to zero, it is determined that the predetermined number of times N1 does not need to be changed (specifically, increased). On the other hand, when the change amount PN1 is not close to zero, it is determined that the predetermined number of times N1 needs to be changed (specifically, increased).

Alternatively, control devices 36, 73 determine whether the predetermined number of repetitions N1 needs to be changed (specifically, decreased) based on whether the change amount PN1 between the mounting positions of mounting/demounting tools 50, 76 before and after the execution of the seating improvement moving operation for the repetition immediately prior to the predetermined number of repetitions N1 is sufficiently close to zero while holding die 44. When the change amount PN1 is close to zero, it is determined that the predetermined number of times N1 needs to be changed (specifically, decreased). On the other hand, when the change amount PN1 is not close to zero, it is determined that the predetermined number of times N1 does not need to be changed (specifically, decreased).

When it is determined that the predetermined number of times N1 does not need to be changed in the above-mentioned step S115, control devices 36, 73 terminate the present routine. On the other hand, when it is determined that the predetermined number of times N1 needs to be changed, control devices 36, 73 next updates the predetermined number of repetitions N1 (step S116). The updating of the predetermined multiple number of repetitions N1 is performed, for example, by setting the predetermined multiple number of repetitions N1 to a number of repetitions N1' greater than the predetermined multiple number of repetitions N1 at that time, or to a number of repetitions N1' greater than the smallest number of repetitions, or margin, among the repetition numbers at which the change amount is sufficiently close to zero while holding die 44, among the above-mentioned change amounts P1, . . . , PN1. The updated predetermined number of times N1 is stored in the memory of control devices 36, 73. After updating the predetermined number of times N1, control devices 36, 73 terminate the present routine.

As described above, in component mounting machine 1 of the first modification, when the seating improvement moving operation of pot holding section 60 or lifting and lowering shaft 78 in the seating improvement process of push-up pot 50 or suction nozzle 76 is repeated multiple times, the number of repetitions N1 to be executed can be set based on the result of the seating improvement moving operation (convergence of the mounting position) performed multiple times N0 or N1 in the previous process. More specifically, it is possible to obtain changes in the mounting positions of mounting/demounting tools 50, 76 with respect to mounting tables 60, 78 before and after the execution of each seating improvement moving operation performed multiple times N0 or N1 in the previous process, respectively, and to set the execution count N1 of the seating improvement moving operation in the next process based on the trend of these changes. For example, even if the seating improvement moving operation is performed a multiple number of times N0 or N1 in the previous process, if the mounting position has not returned to normal, the predetermined number of times N1 can be increased. When the seating improvement moving operation is repeated a multiple number of times N0 or N1 in the previous process and the mounting position converges before the execution of the last seating improvement moving operation, it is possible to reduce the predetermined number of repetitions N1 to the number of repetitions of the seating improvement moving operation at which the mounting position converges. These processes can be executed for each type of mounting/demounting tools 50, 76 and for each individual tool.

Therefore, while seating of mounting/demounting tools 50, 76 with respect to mounting/demounting bases 60, 78 is sufficiently stabilized, the number of repetitions of the seating improvement moving operation of mounting bases 60, 78 for improving the seating of mounting/demounting tools 50, 76 can be changed to an appropriate value, it is possible to avoid a situation where the number of repetitions of the seating improvement moving operation is less than the number of repetitions necessary for convergence of the seating, and avoid unnecessarily executing the seating improvement moving operation for many times. In addition, even if there is a difference in type or individual differences between mounting/demounting tools 50, 76, the seating improvement moving operation of mounting bases 60, 78 can be executed a sufficient number of times to converge the seating in accordance with mounting/demounting tools 50, 76, and the seating of mounting/demounting tools 50 and 76 can be sufficiently stabilized with certainty.

3-2. Second Modification

Control devices 36, 73 may execute the process shown in a second modification instead of the process shown in the first modification. That is, control devices 36, 73 repeat the seating improvement moving operation of mounting bases 60, 78 a predetermined maximum number of times, respectively, and acquire an image with cameras K2, K3, before and after each time the seating improvement moving operation is executed, for the purpose of determining whether the mounting position of mounting/demounting tools 50, 76 has converged with respect to mounting bases 60, 78. Whether the seating is stable, that is, whether the mounting position of mounting/demounting tools 50, 76 with respect to mounting bases 60, 78 has converged is determined based on the imaging result for each execution of the seating improvement moving operation. As a result, the repetition of the seating improvement moving operation is terminated when convergence occurs. On the other hand, when the seating improvement moving operation has performed the predetermined maximum number of times but none of them converges, the attaching and detaching of mounting/demounting tools 50, 76 to and from mounting bases 60, 78 may be performed again.

Figure 12:
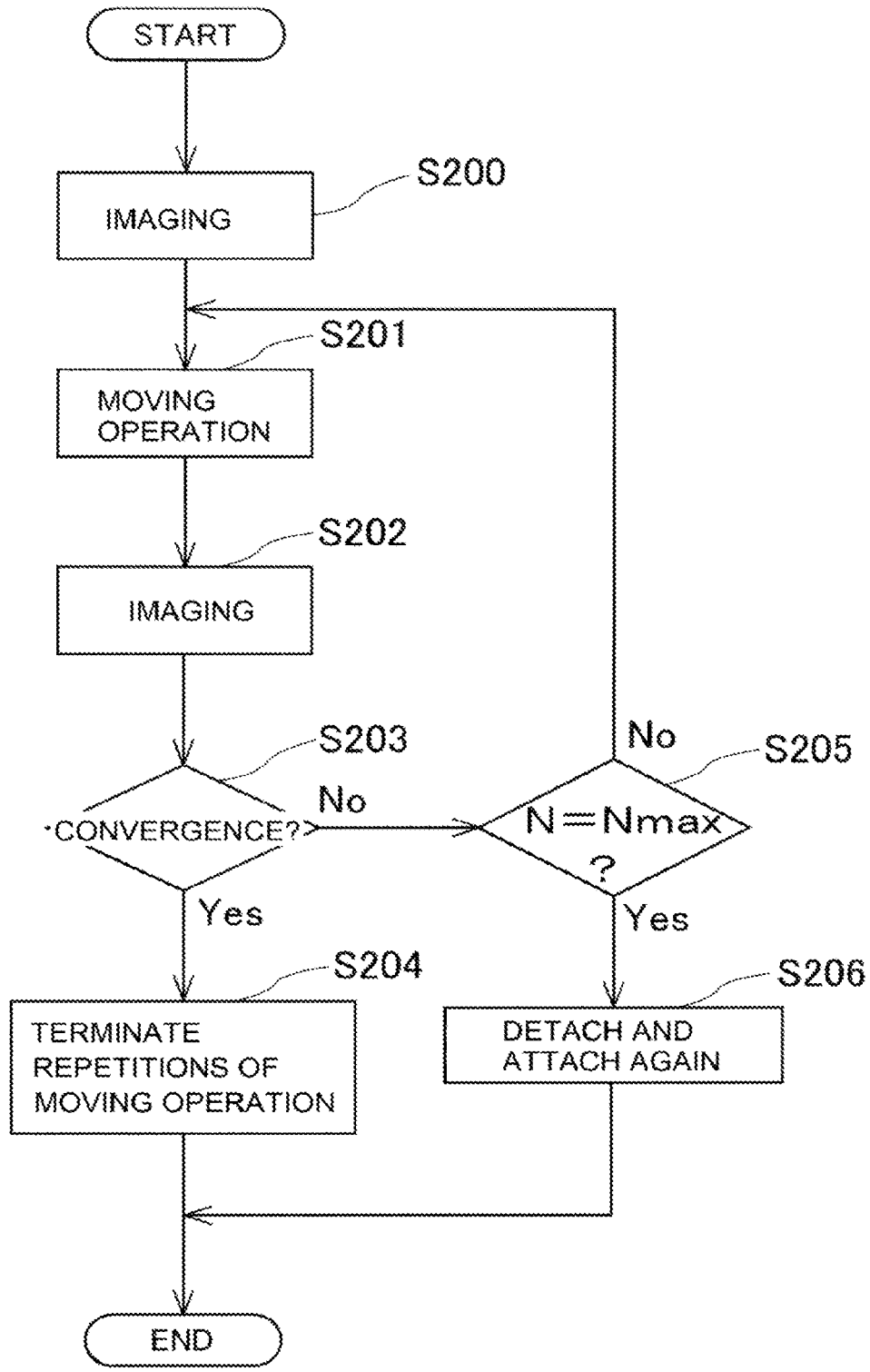
FIG. 12 A flowchart of an example of a control routine executed in the component mounting machine according to a second modification.

More specifically, each of control devices 36, 73 executes the control routine shown in FIG. 12 when push-up pot 50 or suction nozzle 76 is exchanged after restarting or booting up such as when the power of component mounting machine 1 is turned on or when the door is opened for manual operation by an operator.

After exchanging mounting/demounting tools 50, 76, control devices 36, 73 use cameras K2, K3 to image the mounting positions of mounting/demounting tools 50, 76 with respect to mounting bases 60, 78 (step S200). Next, X-axis motor 35x and Y-axis motor 35y of driving device 35 or X-axis servomotor 71x and Y-axis servomotor 71y of XY robot 71 perform the seating improvement moving operation of mounting bases 60, 78 once (step S201). Then, after the seating improvement moving operation is completed once, the mounting position of mounting/demounting tools 50, 76 with respect to mounting bases 60, 78 is imaged using cameras K2, K3 (step S202).

Next, control devices 36, 73 determine whether the mounting position of mounting/demounting tools 50, 76 converges with respect to mounting bases 60, based on the imaging results of the mounting position of mounting/demounting tools 50, 76, obtained before and after the immediately preceding seating improvement moving operation was executed, by the processes of above-described steps S200, S202 (step S203). The convergence or non-convergence of the mounting position may be determined based on whether the change amount in the mounting position of mounting/demounting tools 50, 76 before and after the execution of the seating improvement moving operation is sufficiently close to zero while holding die 44. As a result, when it is determined that the mounting positions of mounting/demounting tools 50, 76 converge, control devices 36, 73 terminate the repetition of the seating improvement moving operation of mounting bases 60, 78, which is the seating improvement process of mounting/demounting tools 50, 76 (step S204), and terminate the present routine.

On the other hand, when it is determined that the mounting positions of mounting/demounting tools 50, 76 do not converge, control devices 36, 73 next determine whether the number of times N the seating improvement moving operation of mounting bases 60, 78 has been executed has reached the predetermined maximum number Nmax after the present seating improvement process is started (step S205). The predetermined maximum number of times Nmax is the largest number of times that the seating improvement moving operation of mounting bases 60, 78 can be performed in a seating improvement process for improving the seating of mounting/demounting tools 50, 76, and is set to a value of "2" or more and stored in memory. The predetermined maximum number of times Nmax may be set for each type of mounting/demounting tool 50, 76.

When it is determined that the relationship of N=Nmax is not established by the process of step S205, that is, the relationship of N<Nmax is established, control devices 36, 73 repeatedly execute the process of step S201 and execute the seating improvement moving operation again. On the other hand, when it is determined that the relationship of N=Nmax is established by the process of above-mentioned step S205, the demounting and mounting of mounting/demounting tools 50, 76 to and from mounting bases 60, 78 is performed again (step S206). That is, mounting/demounting tools 50, 76 are removed once from mounting bases 60, 78, returned to stations 37, 74, and thereafter, mounting/demounting tools 50, 76 are attached and mounted on mounting bases 60, 78 again. After the detaching and attaching mounting/demounting tools 50, 76 is re-executed, the present routine is finished and the routine shown in FIG. 11 is started again.

As described above, in component mounting machine 1 of the second modification, the seating improvement moving operation of pot holding section 60 and lifting and lowering shaft 78 in the seating improvement process of push-up pot 50 and suction nozzle 76 can be repeatedly executed multiple times until the mounting positions of mounting tools 50, 76 converge with respect to mounting bases 60, 78. Therefore, while the seating of mounting/demounting tools 50, 76 with respect to mounting bases 60, 78 is sufficiently stabilized by the seating improvement moving operation, it is possible to avoid many unnecessary executions of the seating improvement moving operation.

If the mounting positions of mounting/demounting tools 50, 76 do not converge with respect to mounting bases 60, 78 even if the repetitions of the seating improvement moving operation of mounting bases 60, 78 reaches the predetermined maximum number of times Nmax, since attaching and detaching of mounting/demounting tools 50, 76 with respect to mounting bases 60, 78 is executed again, it is possible re-position mounting/demounting tools 50, 76 with respect to mounting bases 60, 78 and achieve stability.

3-3. Other Modifications

Figure 13:
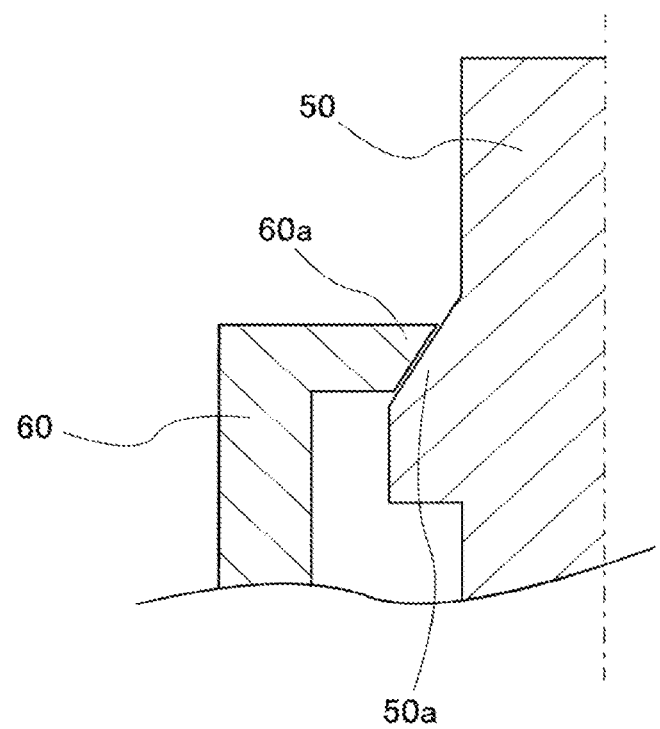
FIG. 13 A partial cross-sectional view of the push-up unit according to another modification.

In the above-described embodiment, push-up pot 50 is mounted on pot holding section 60 by engaging hooking pieces 56 of push-up pot 50 with positioning members 62 of pot holding section 60, engaging engagement member 57 of push-up pot 50 with fitting recessed section 64 of pot holding section 60, and engaging lock pin 58 of engagement member 57 with lock member 65. However, the present disclosure is not limited to this. push-up pot 50 may be mounted to pot holding section 60 by taper clamping the taper section 50a of push-up pot 50 and taper section 60a of pot holding section 60, as shown in FIG. 13. Even when an axial deviation occurs between push-up pot 50 and pot holding section 60 by such a taper clamp, the seating improvement moving operation of pot holding section 60 is performed so that the mounting position of push-up pot 50 with respect to pot holding section 60 can converge to stabilize the seating.

In the above embodiment, suction nozzle 76 of mounting head 72 is detachably mounted on lifting and lowering shaft 78 and picks up die 44 pushed up by push-up pin 52 of push-up pot 50. However, the present disclosure is not limited to this. The pick-up target of the suction nozzle may be a component supplied by a tape feeder or the like instead of die 44 pushed up by push-up pin 52.

Further, in the above embodiment, the seating is stabilized for both the mounting position of push-up pot 50 with respect to pot holding section 60 and the mounting position of suction nozzle 76 with respect to lifting and lowering shaft 78. However, the present disclosure is not limited to this. At least one of the mounting position of push-up pot 50 with respect to pot holding section 60 and the mounting position of suction nozzle 76 with respect to lifting and lowering shaft 78 may be applied to stabilize the seating.

It should be noted that the present disclosure is not limited to the above-described embodiment and modifications, and various further modifications can be made without departing from the spirit and scope of the present disclosure.

REFERENCE SIGNS LIST

1: Component mounting machine, 10: Main body section, 20: Board conveyance device, 30: Component supply device, 31: Die supply device, 34: push-up unit, 35: Driving device, 36: Control device, 37: Pot station, 43: Dicing sheet, 44: Die, 50: Push-up pot, 51: Pot main body, 52: Push-up pin, 55: flange part, 56: catch piece, 57: Engagement member, 58: Lock pin, 59: Spring, 60: Pot holding section, 61: Positioning block 62: Positioning member, 63: Engaging block, 64: Fitting recessed section, 70: Component transfer device, 71: XY robot, 72: Mounting head, 73: Dicing sheet, 74: Nozzle station, 75: Head main body, 76: Suction nozzle, 77: Nozzle lifting and lowering mechanism, 78: Lifting and lowering shaft, 79: First lifting and lowering device, 80: Second lifting and lowering device, 81: Rotating device, 96: Locking pin, 97: J slot, 98: Locking ring, 99: Coil spring.

The invention claimed is:

1. A component mounting machine, comprising:
a mounting base provided in a component mounting machine main body and movable at least in a horizontal direction;
a mounting/demounting tool, detachably mounted on the mounting base and movable in an up-down direction, the mounting/demounting tool configured to hold a component;
a tool moving mechanism configured to move the mounting/demounting tool in the up-down direction, the tool moving mechanism including a first motor;
a mounting base moving mechanism configured to move the mounting base at least in the horizontal direction, the mounting base moving mechanism including a second motor; and
a processing circuitry configured to
perform a tool exchange process by controlling the mounting base moving mechanism to mount the mounting/demounting tool on the mounting base,
after the tool exchange process, perform a seating improvement process by controlling the mounting base moving mechanism to move the mounting base in a first moving operation to apply a force in at least the horizontal direction, to the mounting base on which the mounting/demounting tool is mounted, and
after the seating improvement process, perform a mounting process to mount the component on the mounting/demounting tool by controlling the mounting base moving mechanism and the tool moving mechanism to move the mounting/demounting tool in a second moving operation different from the first moving operation.

2. The component mounting machine of claim 1, wherein the processing circuitry repeatedly executes the first moving operation in the mounting base moving mechanism multiple times after the mounting/demounting tool is mounted on the mounting base but before the mounting/demounting tool holds the component.

3. The component mounting machine of claim 2, wherein the processing circuitry vibrates the mounting base in the first moving operation after the mounting/demounting tool is mounted on the mounting base but before the mounting/demounting tool holds the component.

4. The component mounting machine of claim 2, wherein the processing circuitry repeats the second moving operation a predetermined multiple number of times;
wherein the component mounting machine further comprises a camera configured to image a mounting position of the mounting/demounting tool with respect to the mounting base for each execution of the second moving operation; and
wherein the processing circuitry includes a repetition number changing section configured to change the predetermined multiple number of times for repeating the second moving operation as a next seating improvement process based on the imaging results, being imaged by the camera, of the mounting position in the predetermined multiple number of repetitions.

5. The component mounting machine of claim 2, wherein the processing circuitry repeats the second moving operation a predetermined maximum number of times,
wherein the component mounting machine further comprises a camera configured to image the mounting position of the mounting/demounting tool with respect to the mounting base for each execution of the second moving operation; and wherein the processing circuitry terminates the repetitions of the second moving operation when the mounting position imaged with the camera converges.

6. The component mounting machine of claim 5, wherein the processing circuitry performs a second tool exchange process when the mounting position imaged by the camera does not converge even if the second moving operation is repeated the predetermined maximum number of times.

* * * * *